US010379853B2

(12) United States Patent
Gopal et al.

(10) Patent No.: US 10,379,853 B2
(45) Date of Patent: Aug. 13, 2019

(54) SLIDING WINDOW ENCODING METHODS FOR EXECUTING VECTOR COMPARE INSTRUCTIONS TO WRITE DISTANCE AND MATCH INFORMATION TO DIFFERENT SECTIONS OF THE SAME REGISTER

(71) Applicant: Intel Corporation, Santa Clara, CA (US)

(72) Inventors: Vinodh Gopal, Westborough, MA (US); James D. Guilford, Northborough, MA (US); Gilbert M. Wolrich, Framingham, MA (US)

(73) Assignee: Intel Corporation, Santa Clara, CA (US)

( * ) Notice: Subject to any disclaimer, the term of this patent is extended or adjusted under 35 U.S.C. 154(b) by 80 days.

(21) Appl. No.: 15/346,655

(22) Filed: Nov. 8, 2016

(65) Prior Publication Data

US 2017/0052784 A1 Feb. 23, 2017

Related U.S. Application Data

(62) Division of application No. 13/730,732, filed on Dec. 28, 2012, now Pat. No. 9,489,199.

(51) Int. Cl.
*G06F 9/30* (2018.01)
*G06F 7/02* (2006.01)
(Continued)

(52) U.S. Cl.
CPC ............ *G06F 9/30021* (2013.01); *G06F 7/02* (2013.01); *G06F 9/30036* (2013.01);
(Continued)

(58) Field of Classification Search
CPC .... G06F 9/30021; G06F 9/30036; G06F 7/02; G06F 2207/025; H03M 7/30; H03M 7/3086; G06K 9/6201
See application file for complete search history.

(56) References Cited

U.S. PATENT DOCUMENTS 5,493,689 A 2/1996 Waclawsky et al.
5,612,693 A 3/1997 Craft et al.
(Continued)

FOREIGN PATENT DOCUMENTS

| TW | 200908571 A | 2/2009 |
| WO | 2009005758 A2 | 1/2009 |
| WO | 2013095615 A1 | 6/2013 |

OTHER PUBLICATIONS

Intel, "IA-64 Application Developer's Architecture Guide", May 1999, pp. 7:145-146 and 159-161, and C:17.*
(Continued)

*Primary Examiner* — David J. Huisman
(74) *Attorney, Agent, or Firm* — Nicholson De Vos Webster & Elliott LLP

(57) ABSTRACT

A processor is described having an instruction execution pipeline having a functional unit to execute an instruction that compares vector elements against an input value. Each of the vector elements and the input value have a first respective section identifying a location within data and a second respective section having a byte sequence of the data. The functional unit has comparison circuitry to compare respective byte sequences of the input vector elements against the input value's byte sequence to identify a number of matching bytes for each comparison. The functional unit also has difference circuitry to determine respective distances between the input vector's elements' byte sequences and the input value's byte sequence within the data.

14 Claims, 19 Drawing Sheets

(51) Int. Cl.
*G06K 9/62* (2006.01)
*H03M 7/30* (2006.01)

(52) U.S. Cl.
CPC ........ *G06K 9/6201* (2013.01); *H03M 7/3086* (2013.01); *G06F 2207/025* (2013.01)

(56) References Cited

U.S. PATENT DOCUMENTS

| | | | |
|---|---|---|---|
| 5,903,282 | A | 5/1999 | Schoner et al. |
| 6,070,003 | A | 5/2000 | Gove et al. |
| 7,307,552 | B2 | 12/2007 | Ma et al. |
| 7,353,233 | B1 | 4/2008 | Ganca |
| 7,532,358 | B2 | 5/2009 | Clothier et al. |
| 7,719,978 | B2 | 5/2010 | Taubman et al. |
| 7,872,598 | B2 | 1/2011 | Baktir et al. |
| 8,125,357 | B1 | 2/2012 | Hamlet et al. |
| 8,325,357 | B2 | 12/2012 | Hasebe |
| 8,855,938 | B2 | 10/2014 | Friedlander et al. |
| 8,872,677 | B2 | 10/2014 | Litvak et al. |
| 8,947,270 | B2 | 2/2015 | Gopal et al. |
| 9,203,887 | B2 | 12/2015 | Gopal et al. |
| 2001/0038642 | A1 | 11/2001 | Alvarez et al. |
| 2001/0051969 | A1 | 12/2001 | Oberman et al. |
| 2002/0057716 | A1 | 5/2002 | Svanbro et al. |
| 2003/0212879 | A1 | 11/2003 | Henkel et al. |
| 2004/0170175 | A1 | 9/2004 | Frank et al. |
| 2005/0104753 | A1 | 5/2005 | Dror et al. |
| 2006/0037023 | A1 | 2/2006 | Dieffenderfer et al. |
| 2006/0155967 | A1 | 7/2006 | Wang et al. |
| 2009/0063762 | A1 | 3/2009 | Owsley et al. |
| 2010/0262806 | A1 | 10/2010 | Doing et al. |
| 2012/0262314 | A1 | 10/2012 | Carlson |
| 2013/0325329 | A1 | 12/2013 | Gupta et al. |
| 2014/0019718 | A1 | 1/2014 | Kuo |
| 2014/0156790 | A1 | 6/2014 | Gopal et al. |
| 2014/0358965 | A1* | 12/2014 | Sugiyama ........... G06F 15/8007 707/769 |

OTHER PUBLICATIONS

Wikipedia, "Division Algorithm", Dec. 5, 2012, pp. 1-5.*
Allen et al., "Enhancing Screen Teleconferencing with Streaming SIMD Extensions", 2002,7 pages.
Huffman "A method for the construction of minimum redundancy codes", Proceedings of the IRE, 1952, vol. 40 (9), pp. 1098-1101.
"Deflate Compressed Data Format Specification Version 1.3," faqs.org. 28 pages. May 1996. Web. Accessed Jul. 16, 2015. http://www.faqs.org/rfcs/rfc1951.html.
Final Office Action from U.S. Appl. No. 13/730,732 dated Mar. 24, 2016, 16 pages.
Intel, "IA-64 Application Developers Architecture Guide", May 1999, pp. 7:145-146, 159-161, and C:17.
International Preliminary Report on Patentability and Written Opinion received for PCT Patent Application No. PCT/US2011/067092, dated Jul. 3, 2014, 5pages.
International Search Report and Written Opinion received for PCT Application No. PCT/US2011/067092, dated Sep. 27, 2012, 8 pages.
Klein et al., "Parallel Lempel Ziv Coding", 2004, pp. 180-191.
Non-Final Office Action from U.S. Appl. No. 13/730,732 dated Aug. 31, 2015, 22 pages.
Non-Final Office Action from U.S. Appl. No. 13/730,732 dated Dec. 31, 2015, 7 pages.
Non-Final Office Action from U.S. Appl. No. 13/931,877 dated Jun. 13, 2014, 8 pages.
Non-Final Office Action from U.S. Appl. No. 14/595,129 dated Jul. 16, 2015, 11 pages.
Notice of Allowance from the U.S Appl. No. 13/994,129, dated Jul. 23, 2015, 13 pages.
Notice of Allowance from U.S. Appl. No. 13/730,732 dated Jul. 8, 2016, 6 pages.
Notice of Allowance from U.S. Appl. No. 13/730,732 dated Jun. 21, 2016, 7 pages.
Notice of Allowance from U.S. Appl. No. 13/931,877, dated Sep. 26, 2014, 9 pages.
Notice of Allowance from U.S Appl. No. 14/595,129, dated Nov. 10, 2015, 9 pages.
Office action and Search Report with English translation from Taiwan Patent Application No. 103121589, dated May 28, 2015, 9 pages.
Office action with English translation from Korean Patent Application No. 10-2015-7013831, dated Dec. 18, 2015, 11 pages.
PCT/US2013/048333 Notification of Transmittal of the International Search Report and the Written Opinion of the International Searching Authority, or the Declaration, dated Sep. 25, 2013, 10 pages.
PCT/US2014/042372 Notification of Transmittal of the International Search Report and the Written Opinion of the International Searching Authority, dated Sep. 30, 2014, 11 pages.
"Specification of the 3GPP Confidentiality and Integrity Algorithms 128-EEA3 & 128-EIA3, Document 2: ZUC Specification", ETSI/SAGE Specification, Version:1.6, Date: Jun. 28, 2011, The ZUC algorithm is the core of the standardized 3GPP Confidentiality and Integrity algorithms 128-EEA3 & 128-EIA3, 3GPP Confidentiality and Integrity Algorithms 128-EEA3 & 128-EIA3, ZUC Algorithm Specification Verison 1.6, pp. 1-18.
Ziv Jacob et al., "A Universal Algorithm for Sequential Data Compression", IEEE Transactions on Information Theory, May 1977, vol. 23, No. 3, pp. 337-343.
International Preliminary Report on Patentability for Application No. PCT/US2013/048333 dated Jun. 30, 2015, 6 pages.

* cited by examiner

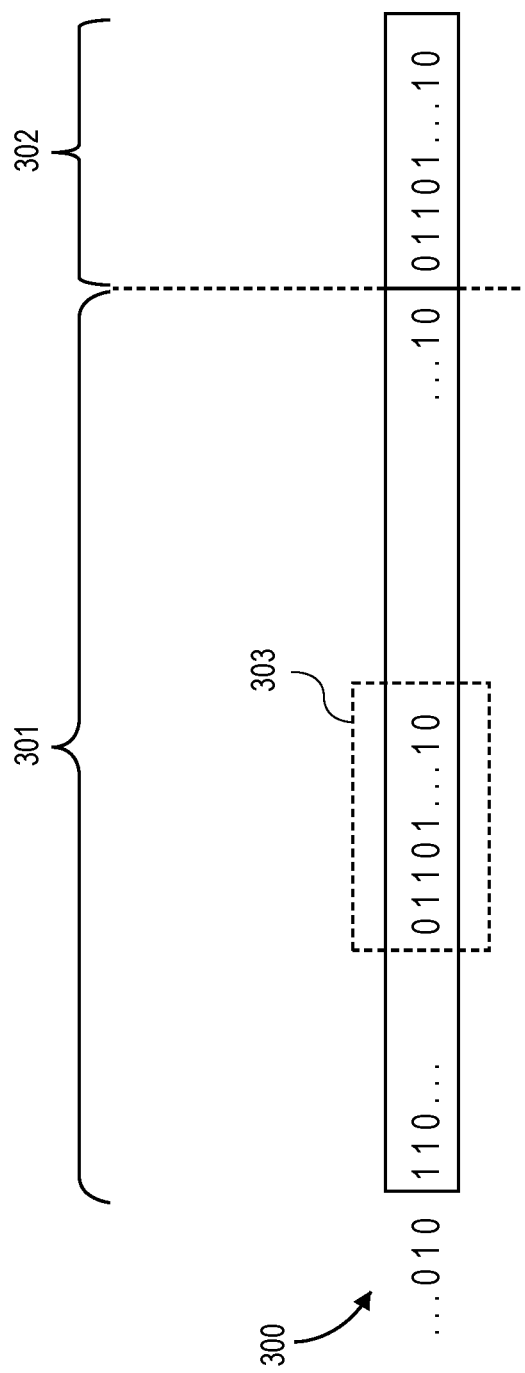

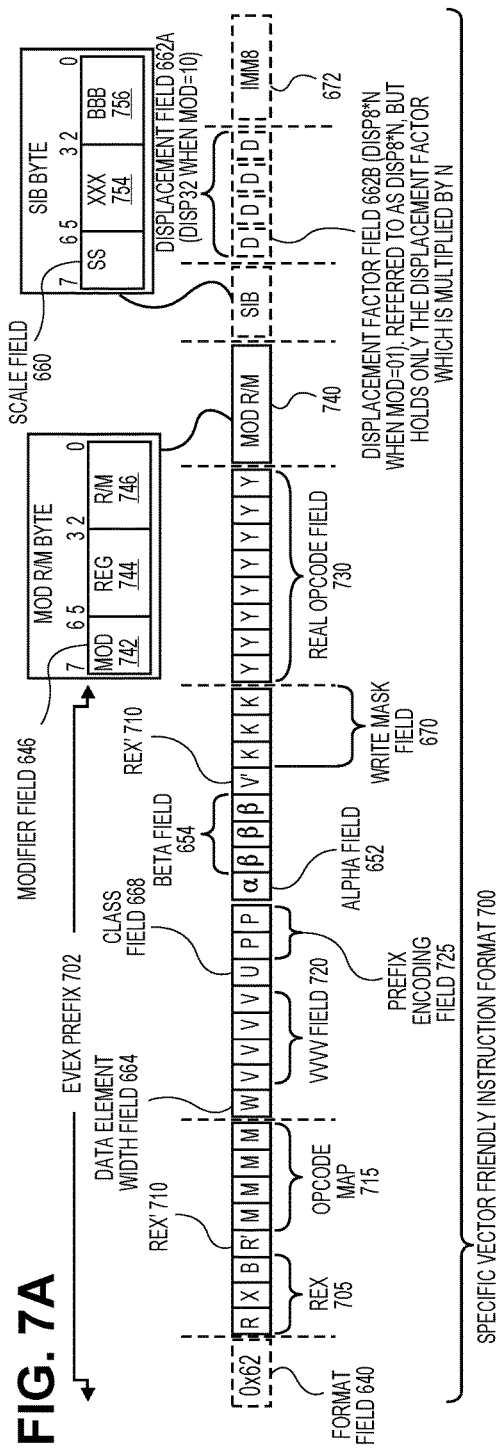
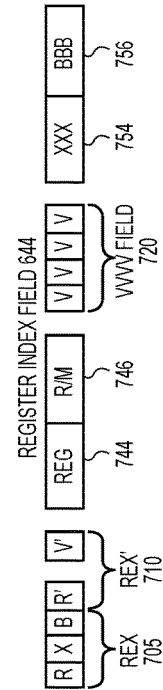
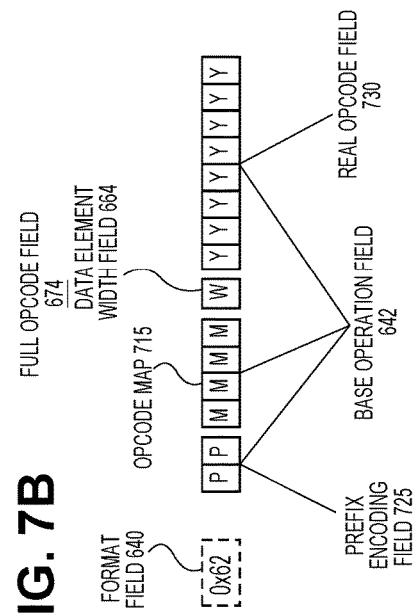
FIG. 7A
FIG. 7B
FIG. 7C

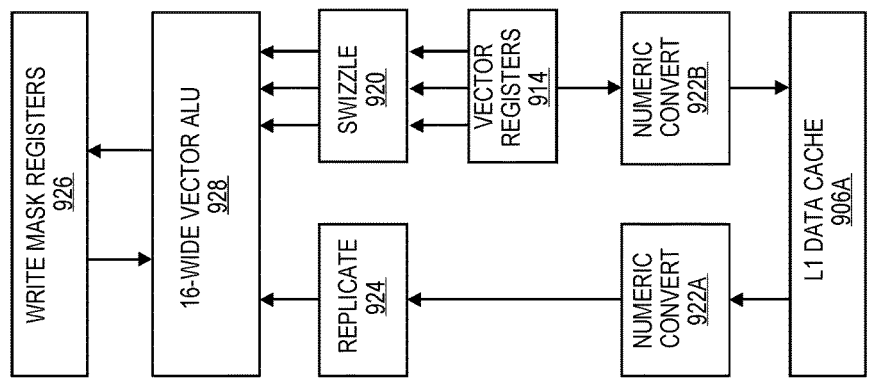
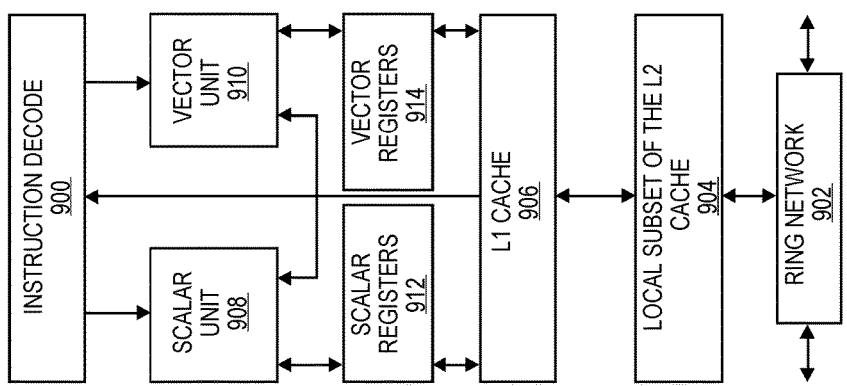
FIG. 9B
FIG. 9A

SLIDING WINDOW ENCODING METHODS FOR EXECUTING VECTOR COMPARE INSTRUCTIONS TO WRITE DISTANCE AND MATCH INFORMATION TO DIFFERENT SECTIONS OF THE SAME REGISTER

CROSS-REFERENCE TO RELATED APPLICATIONS

The present patent application is a divisional application claiming priority from U.S. patent application Ser. No. 13/730,732, filed Dec. 28, 2012, issued as U.S. Pat. No. 9,489,199, and titled: "Vector Compare Instructions for Sliding Window Encoding", which is incorporated herein by reference in its entirety.

FIELD OF INVENTION

The field of invention relates to computing systems generally, and, more specifically, to instructions for sliding window encoding algorithms.

BACKGROUND

Vector Processing

FIG. 1 shows a high level diagram of a processing core 100 implemented with logic circuitry on a semiconductor chip. The processing core includes a pipeline 101. The pipeline consists of multiple stages each designed to perform a specific step in the multi-step process needed to fully execute a program code instruction. These typically include at least: 1) instruction fetch and decode; 2) data fetch; 3) execution; 4) write-back. The execution stage performs a specific operation identified by an instruction that was fetched and decoded in prior stage(s) (e.g., in step 1) above) upon data identified by the same instruction and fetched in another prior stage (e.g., step 2) above). The data that is operated upon is typically fetched from (general purpose) register storage space 102. New data that is created at the completion of the operation is also typically "written back" to register storage space (e.g., at stage 4) above).

The logic circuitry associated with the execution stage is typically composed of multiple "execution units" or "functional units" 103_1 to 103_N that are each designed to perform its own unique subset of operations (e.g., a first functional unit performs integer math operations, a second functional unit performs floating point instructions, a third functional unit performs load/store operations from/to cache/memory, etc.). The collection of all operations performed by all the functional units corresponds to the "instruction set" supported by the processing core 100.

Two types of processor architectures are widely recognized in the field of computer science: "scalar" and "vector". A scalar processor is designed to execute instructions that perform operations on a single set of data, whereas, a vector processor is designed to execute instructions that perform operations on multiple sets of data. FIGS. 2A and 2B present a comparative example that demonstrates the basic difference between a scalar processor and a vector processor.

FIG. 2A shows an example of a scalar AND instruction in which a single operand set, A and B, are ANDed together to produce a singular (or "scalar") result C (i.e., AB=C). By contrast, FIG. 2B shows an example of a vector AND instruction in which two operand sets, A/B and D/E, are respectively ANDed together in parallel to simultaneously produce a vector result C, F (i.e., A.AND.B=C and D.AND.E=F). As a matter of terminology, a "vector" is a data element having multiple "elements". For example, a vector V=Q, R, S, T, U has five different elements: Q, R, S, T and U. The "size" of the exemplary vector V is five (because it has five elements).

FIG. 1 also shows the presence of vector register space 107 that is different than general purpose register space 102. Specifically, general purpose register space 102 is nominally used to store scalar values. As such, when, any of execution units perform scalar operations they nominally use operands called from (and write results back to) general purpose register storage space 102. By contrast, when any of the execution units perform vector operations they nominally use operands called from (and write results back to) vector register space 107. Different regions of memory may likewise be allocated for the storage of scalar values and vector values.

Note also the presence of masking logic 104_1 to 104_N and 105_1 to 105_N at the respective inputs to and outputs from the functional units 103_1 to 103_N. In various implementations, for vector operations, only one of these layers is actually implemented—although that is not a strict requirement (although not depicted in FIG. 1, conceivably, execution units that only perform scalar and not vector operations need not have any masking layer). For any vector instruction that employs masking, input masking logic 104_1 to 104_N and/or output masking logic 105_1 to 105_N may be used to control which elements are effectively operated on for the vector instruction. Here, a mask vector is read from a mask register space 106 (e.g., along with input operand vectors read from vector register storage space 107) and is presented to at least one of the masking logic 104, 105 layers.

Over the course of executing vector program code each vector instruction need not require a full data word. For example, the input vectors for some instructions may only be 8 elements, the input vectors for other instructions may be 16 elements, the input vectors for other instructions may be 32 elements, etc. Masking layers 104/105 are therefore used to identify a set of elements of a full vector data word that apply for a particular instruction so as to effect different vector sizes across instructions. Typically, for each vector instruction, a specific mask pattern kept in mask register space 106 is called out by the instruction, fetched from mask register space and provided to either or both of the mask layers 104/105 to "enable" the correct set of elements for the particular vector operation.

LZ77 Compression Algorithm

Compression algorithms strive to reduce an amount of data without sacrificing the information within the data. One type of compression algorithm, referred to as the LZ77 algorithm, achieve compressions by replacing repeated occurrences of data with references to a single copy of that data existing earlier in the input (uncompressed) data stream. A match is encoded by a pair of numbers called a length-distance pair, which is equivalent to the statement "each of the next length characters is equal to the characters exactly distance characters behind it in the uncompressed stream". (The "distance" is sometimes called the "offset" instead.)

To spot matches, the encoder keeps track of some amount of the most recent data, such as the last 2 kB, 4 kB, or 32 kB. The structure in which this data is held is called a "sliding window", which is why LZ77 is sometimes called sliding window compression. The encoder keeps the most recent data within the sliding window to look for matches (and the decoder likewise will keep this data to interpret the matches the encoder refers to).

FIG. 3 shows a simple example of the basic process of an LZ77 encoding scheme. As observed in FIG. 3, the bit patterns of a preceding (earlier or older) portion 301 of a bit stream 300 are compared against a current portion 302 of the bit stream. If a sequence of bits is found in the current portion 302 that matches a sequence of bits in the preceding portion 301, the sequence of bits in the current portion 302 is replaced with a reference to the same sequence of bits in the earlier portion 301. For example, the bit sequence in the current portion 302 would be replaced with a reference to bit sequence 303 in the earlier portion 301. The reference that is inserted for bit sequence 302 would identify the length of bit sequence 302 (which also is the same as the length of bit sequence 303) and the location of bit sequence 303. Thus, upon decoding the compressed stream, when the decoder reaches the reference, it simply "refers" back to bit sequence 303 to reproduce the correct bit sequence for portion 302 of the decoded stream.

A more complicated but more effective version of the encoding process will compute a hash of the leading bytes (e.g., the 3 leading bytes of) the current portion (referred to as a "prefix") and use that as an index into some data structure that holds bit strings of the earlier portion (or the locations of such bit strings) that hashed to the same value.

The LZ77 compression algorithm is used as part of the DEFLATE compression algorithm which is used to compress gzip, Zlib, PKZip and WinZip compression schemes.

FIGURES

The present invention is illustrated by way of example and not limitation in the figures of the accompanying drawings, in which like references indicate similar elements and in which:

FIG. 1 shows an instruction execution pipeline;

FIGS. 2A and 2B pertain to vector processing;

FIG. 3 shows an example of a sliding window encoding process;

FIGS. 7A-C are block diagrams illustrating an exemplary specific vector friendly instruction format according to embodiments of the invention.

Figure 8:
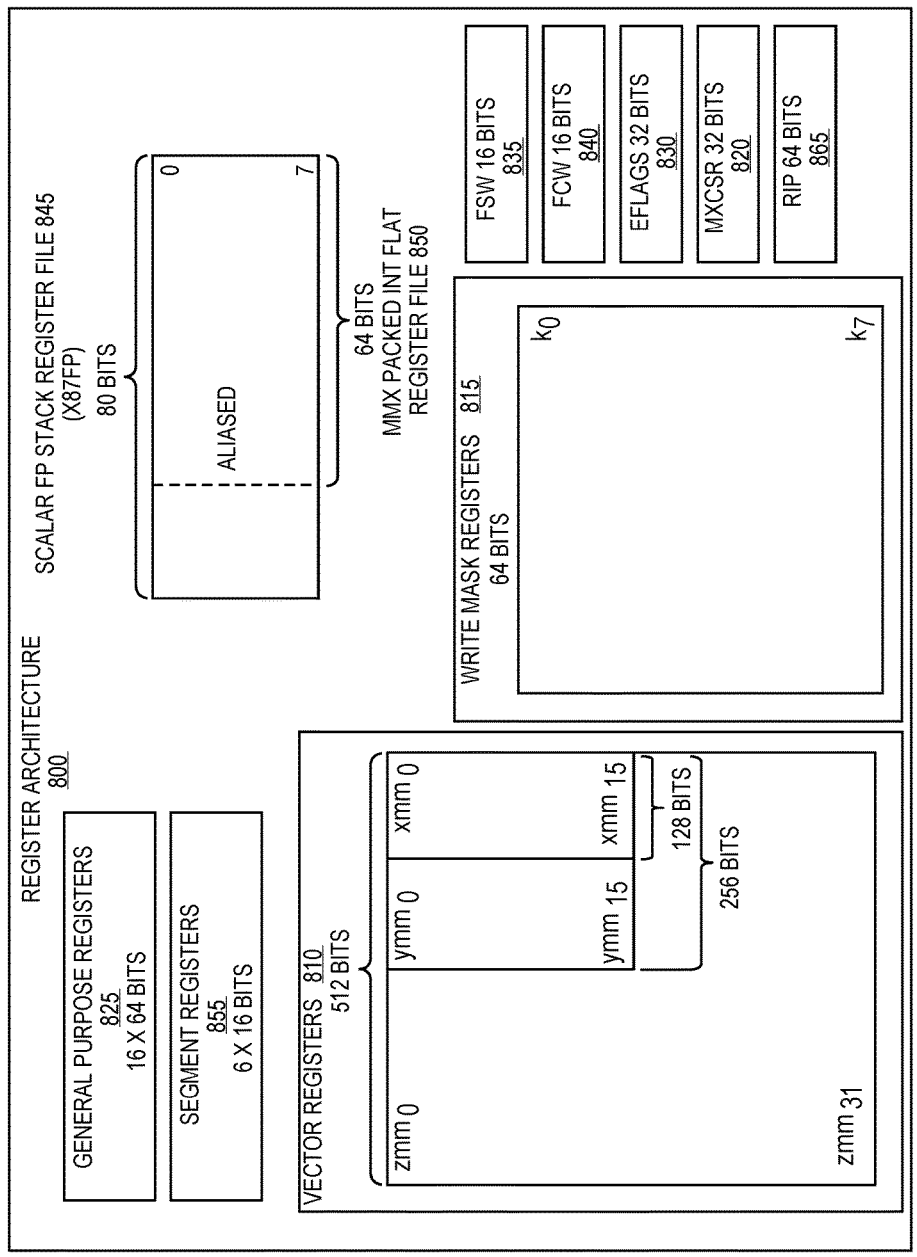

FIG. 8 is a block diagram of a register architecture according to one embodiment of the invention.

FIG. 9A is a block diagram of a single CPU core, along with its connection to the on-die interconnect network and with its local subset of the level 2 (L2) cache, according to embodiments of the invention.

FIG. 9B is an exploded view of part of the CPU core in FIG. 9A according to embodiments of the invention.

Figure 10:
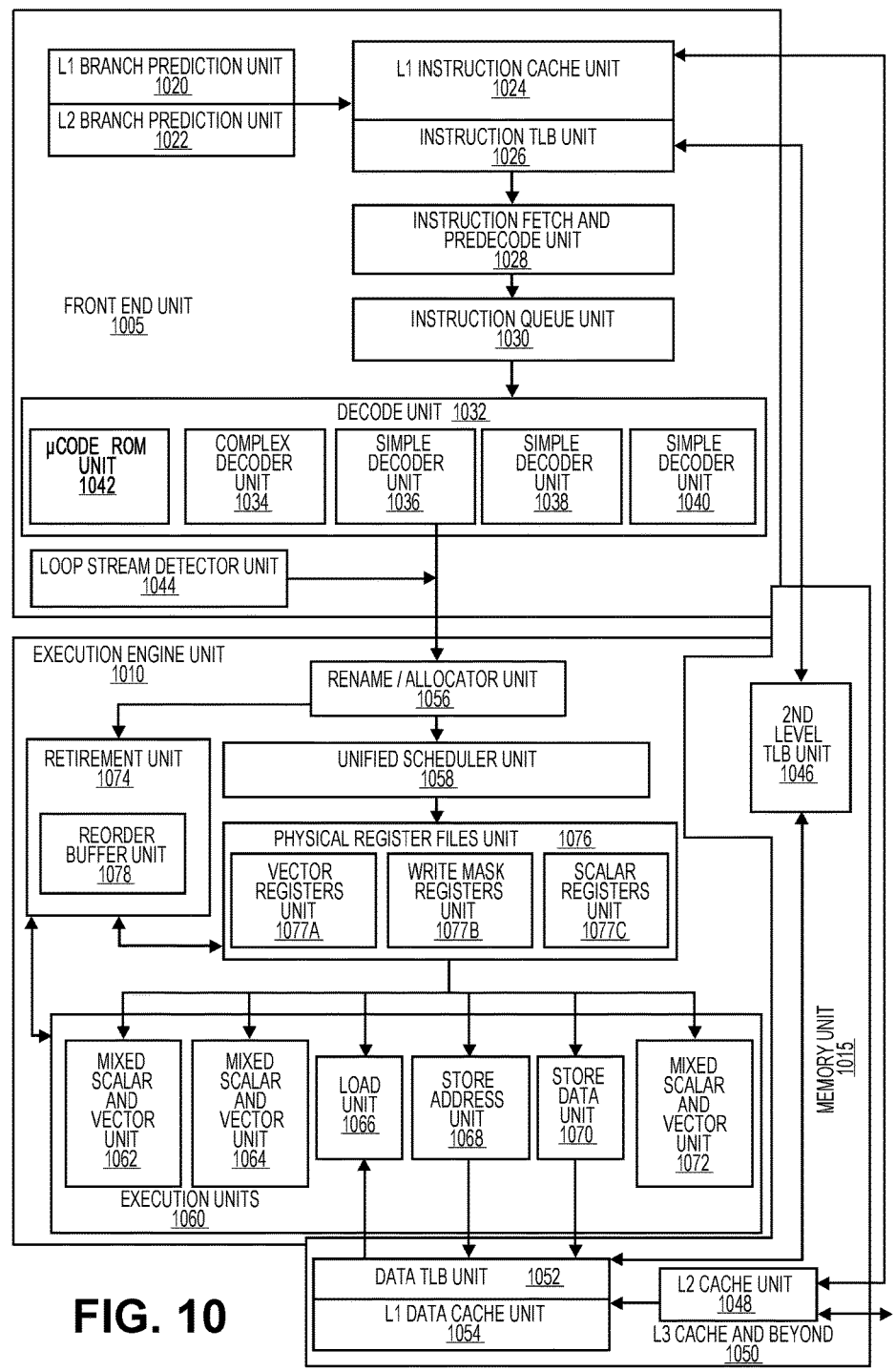

FIG. 10 is a block diagram illustrating an exemplary out-of-order architecture according to embodiments of the invention.

Figure 11:
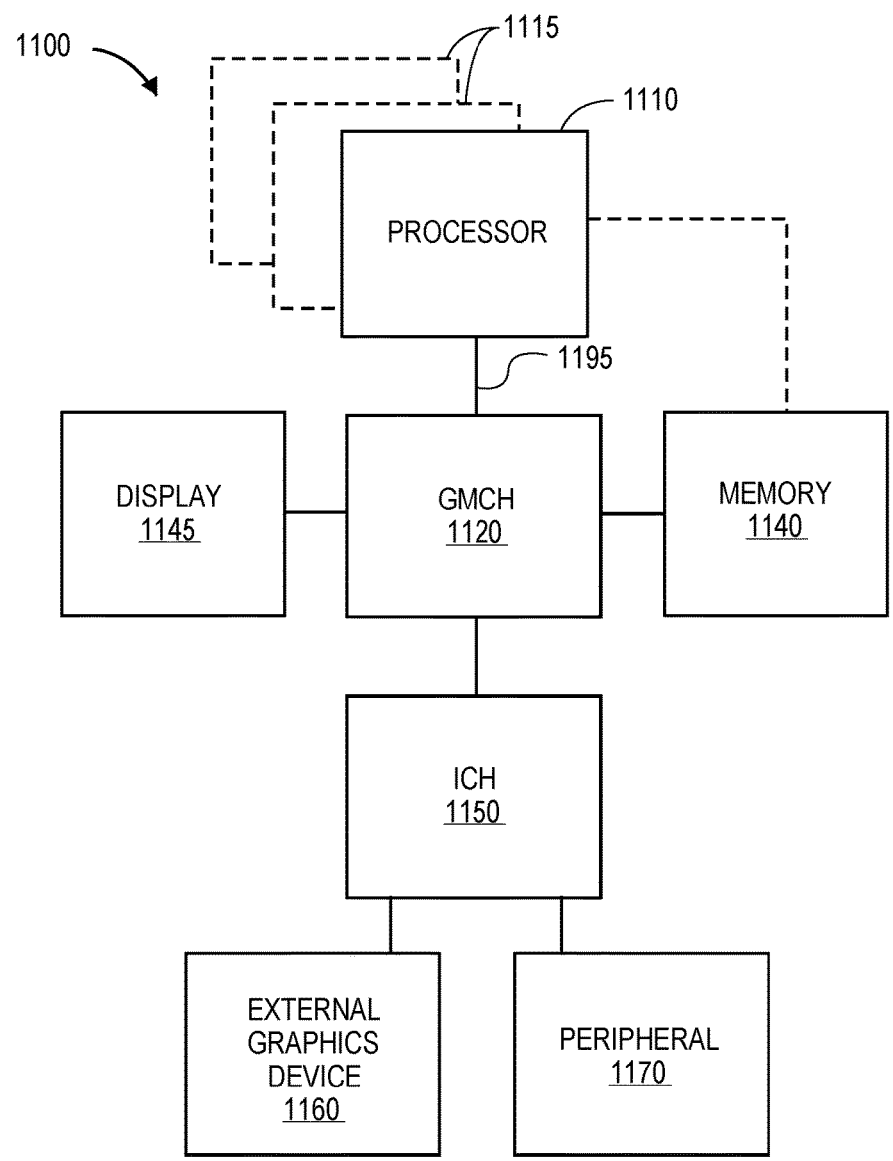

FIG. 11 is a block diagram of a system in accordance with one embodiment of the invention.

Figure 12:
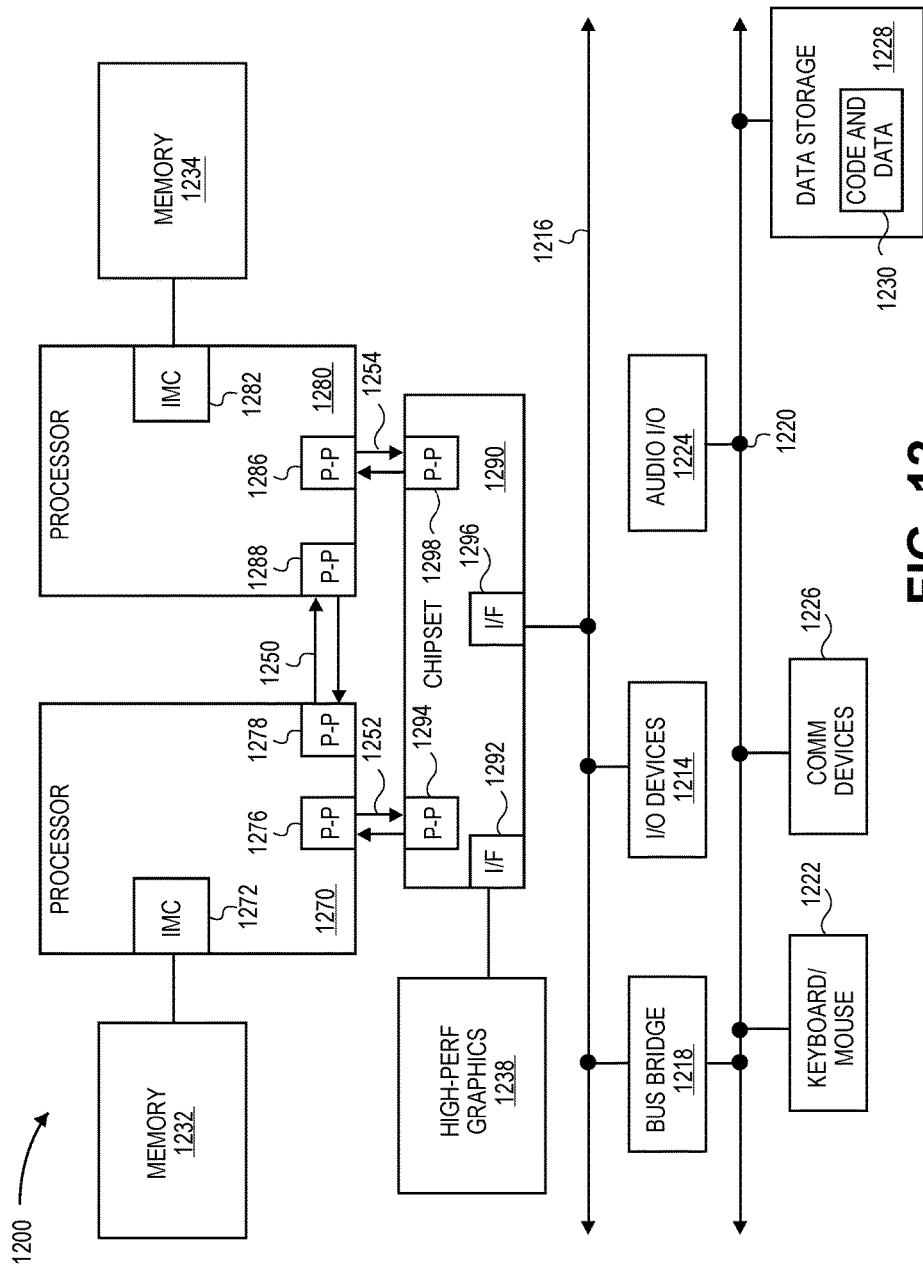

FIG. 12 is a block diagram of a second system in accordance with an embodiment of the invention.

Figure 13:
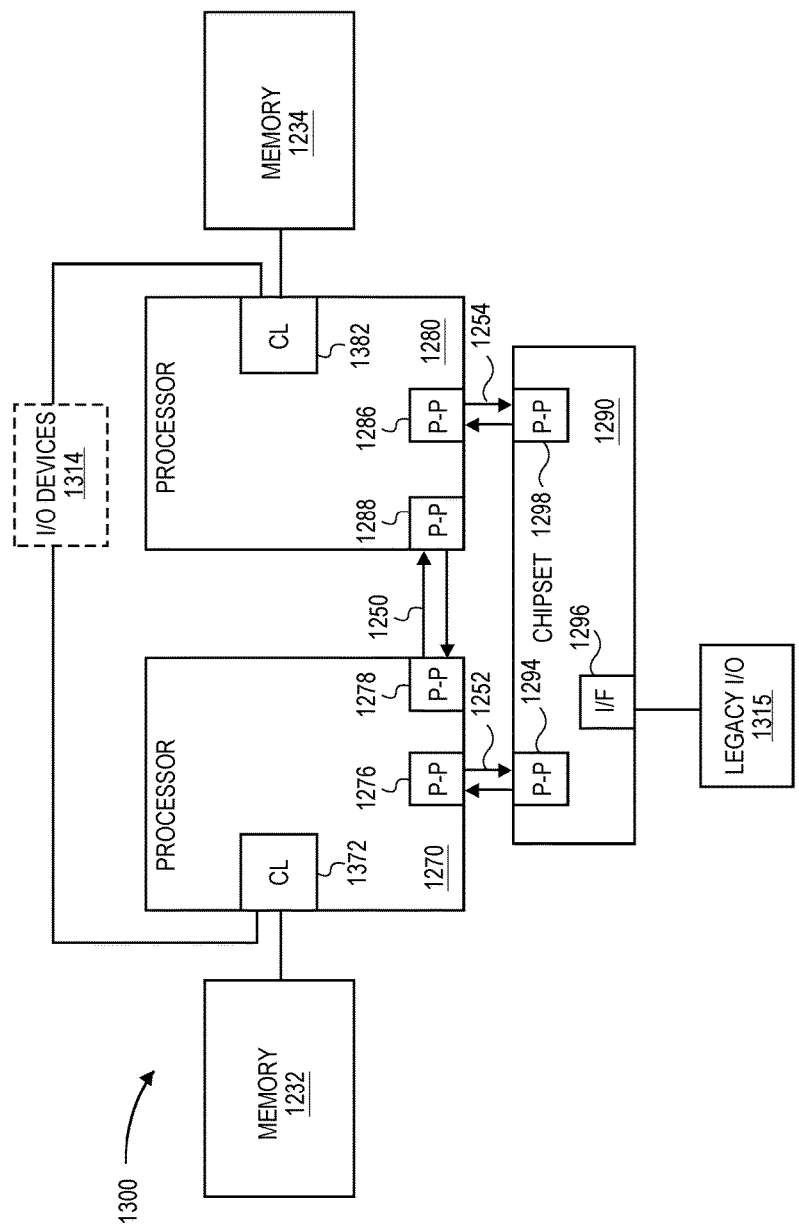

FIG. 13 is a block diagram of a third system in accordance with an embodiment of the invention.

Figure 14:
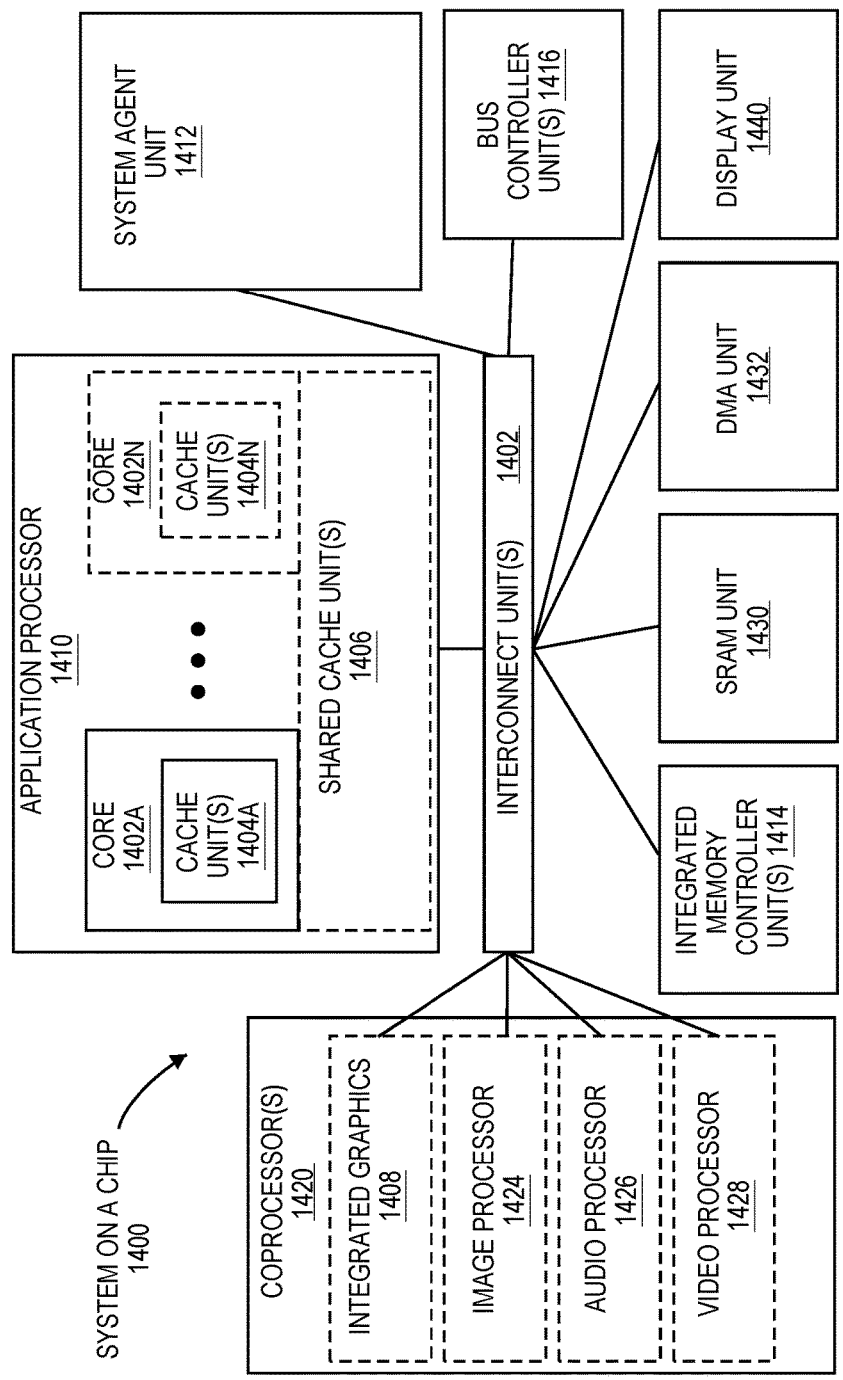

FIG. 14 is a block diagram of a SoC in accordance with an embodiment of the invention.

Figure 15:
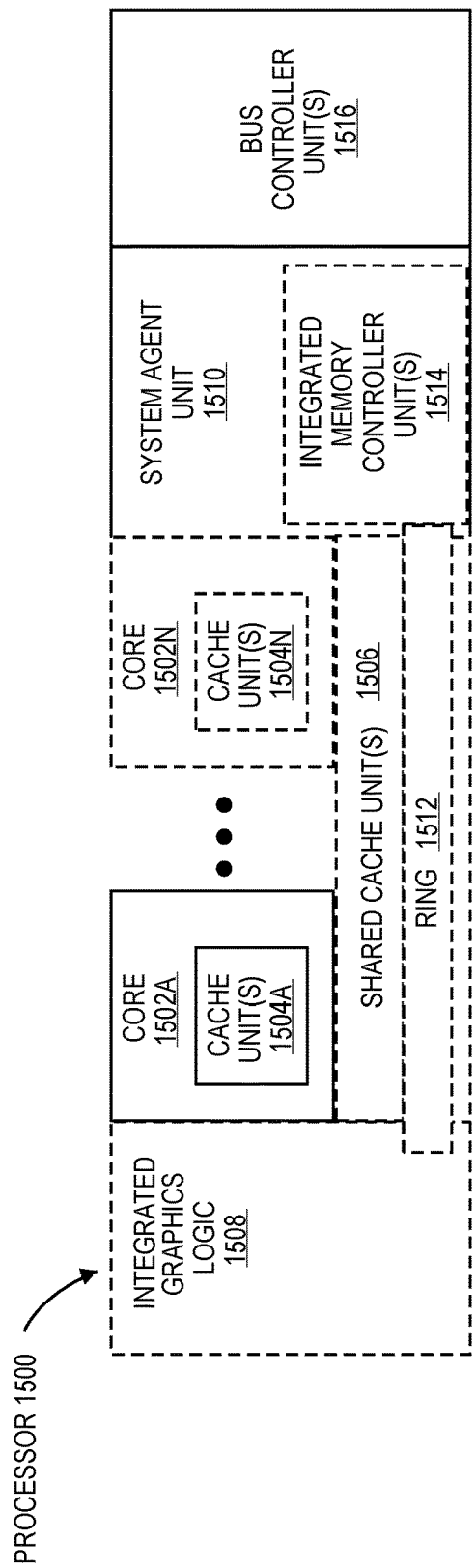

FIG. 15 is a block diagram of a single core processor and a multicore processor with integrated memory controller and graphics according to embodiments of the invention.

Figure 16:
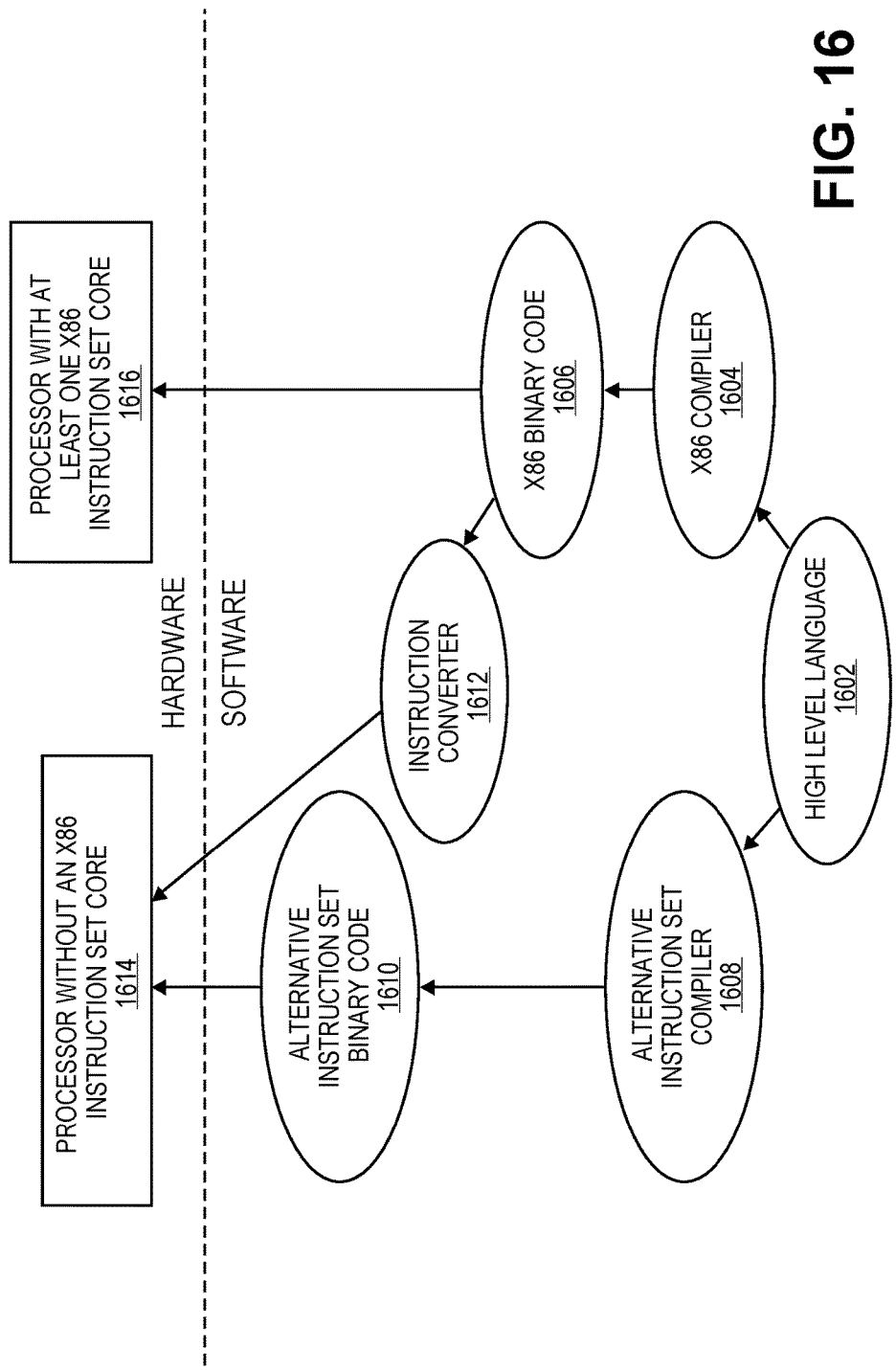

FIG. 16 is a block diagram contrasting the use of a software instruction converter to convert binary instructions in a source instruction set to binary instructions in a target instruction set according to embodiments of the invention.

DETAILED DESCRIPTION

Figure 4A:
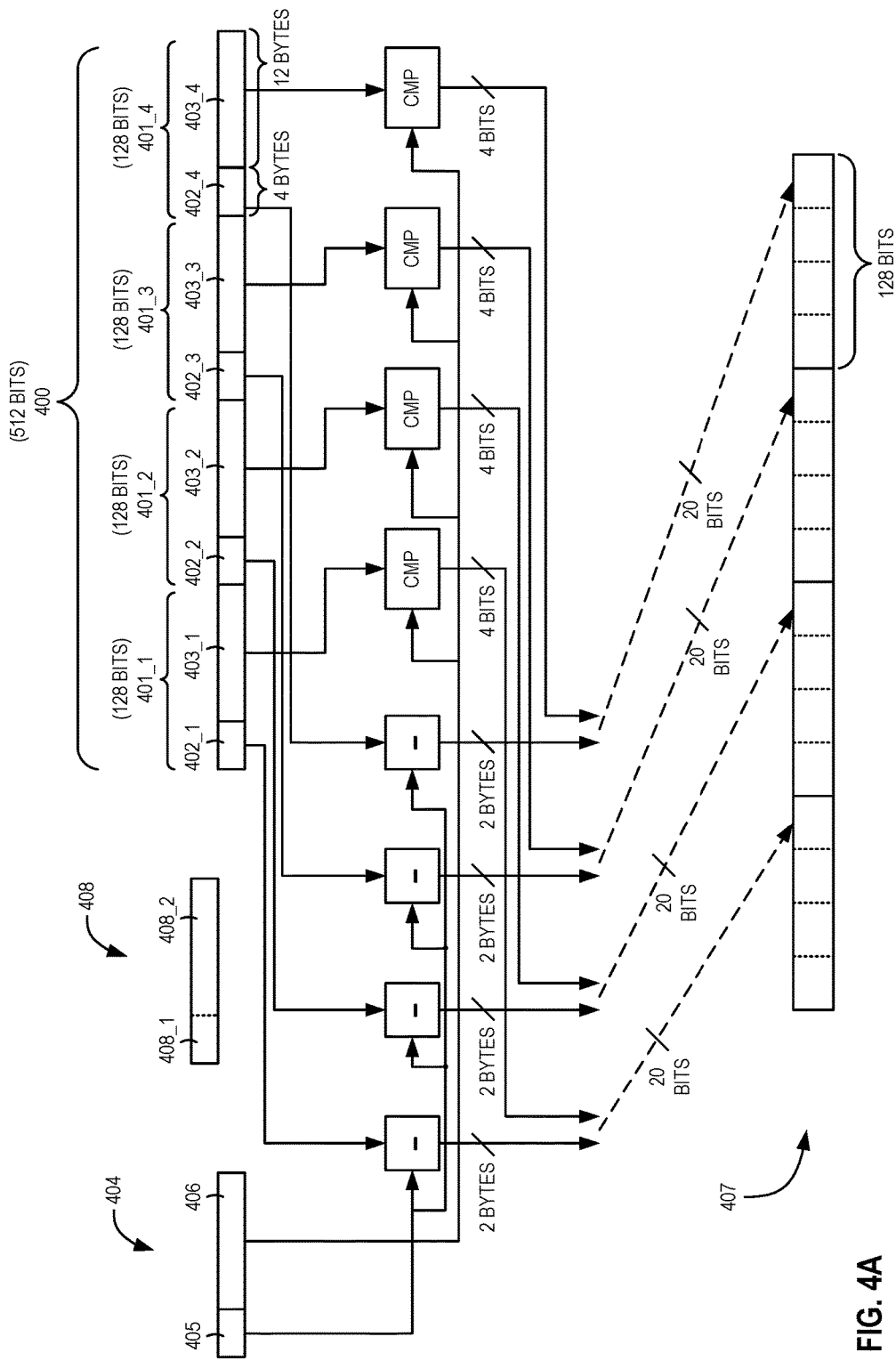
FIG. 4A shows a methodology of an instruction.

FIG. 4A shows operation of an embodiment of a vector instruction (VCOMPCPM) suitable for speeding up a bit-match identification process such as the bit-match identification process of an LZ77 encoding process. FIG. 4A shows a 512 bit first input operand 400. As observed in FIG. 4A, the first input operand 400 is divided into four 128 bit elements 401_1 through 401_4. Each element 401_1 through 401_4 corresponds to a section of a bit stream that is to be encoded according to a bit stream matching process.

Each of the 128 bit elements 401_1 through 401_4 contains a 4 byte "location header" 402_1 through 402_4 and 12 bytes of a contiguous section of the data 403_1 through 403_4. The 4 byte location header specifies where its 12 bytes of contiguous data can be found in the data being encoded. Thus the 512 bit data structure contains four 12 byte sections of the data and the location of each within the data.

A second (e.g., scalar) input operand 404 also has a location header 405 and 12 contiguous bytes 406 of a different section of the data.

As observed in FIG. 4A the instruction compares the 12 bytes of data 406 of the second input operand 404 against each 12 byte data element 403_1 through 403_4 of the first input operand 400, and takes the difference between their respective location header information 402_1 through 402_4 and the location header 405 of the second input operand 404. In comparing two 12 byte sequences, the instruction starts at one end of both sequences (e.g., the rightmost end) and compares byte by byte moving toward the other end (e.g., moving to the left). As soon as a pair of equally positioned different bytes are observed the comparison ends with the number of equally positioned bytes leading up to the first pair of unequal bytes being established as the number of equal bytes for the comparison result for the two 12 byte sequences.

The resultant 407 is therefore a vector whose elements correspond to information that can be used, directly or indirectly, as reference insertion information for each of the comparisons. That is, the resultant 407 specifies, for each element in the first operand 400, a distance between that element's location and the location of the data 406 used for the second input operand 404, and a length (in number of matching bytes) between the two 12 byte sections of data. In the embodiment of FIG. 4A, each element of the resultant reserves 4 bits for the number of matching bytes (but can only specify a maximum value of 12 matching bytes), and reserves 16 bits to specify the location difference in 1's complement form.

In theory, the first input operand 400 can be used to hold "earlier" sections of the data being compressed and the second input operand 404 can be used for the current section of data being compressed, or, the first input operand 400 can be used for the current section of the data being compressed and the second input operand 404 can be used for the earlier section of data being compressed. For simplicity the former approach will be referred to through most of the present specification.

In an embodiment of the instruction of FIG. 4A, a first field of an immediate operand 408_1 is used to essentially specify the size of the sliding window of the compression algorithm. Said another way, the first field 408_1 of the immediate operand 408 specifies how far ahead of the current data of input operand 404 that a match to previous data within input vector 400 is permitted to be found. If any of the location difference calculations exceed the distance specified by the first field 408_1 of the immediate operand 408, the corresponding element in the resultant 407 is provided with a fixed code that signifies the comparison is invalid (e.g., the comparison result is fixed to show that no bytes match).

For example, in an embodiment the first field 408_1 is four bits to specify maximum distances between compared data sections. This corresponds to a maximum distance of 16 where $1/16^{th}$ of this maximum distance corresponds to the minimum distance setting. For example, if the minimum distance setting is 2 kilo bytes (KB), then a first field 408_1 bit length of 4 bits provides for a maximum sliding window size of 32 KB.

Also in an embodiment of the instruction of FIG. 4A, a second field 408_2 of an immediate operand specifies the location of the resultant elements in the resultant vector 407. Here, each resultant element can be viewed as being 128 bits in length, however, only 20 bits of information are provided per element (4 bits identifying how many bytes match in the comparison and 16 bits (2 bytes) specifying the location distance in 1's complement form). In an embodiment, 32 bits of each 128 bit element is recognized as a doubleword or DWORD and the second field 408_2 of the immediate operand specifies which DWORD out of the four DWORDs per element contains the resultant information. For example, in an embodiment, the second field in the immediate operand 408_2 is two bits wide and a value of "00" indicates the rightmost DWORD per element contains the resultant (i.e., bits 415:384; 287:256; 159:128 and 31:0 of the 512 bit output vector 407).

The ability to specify four different locations per vector permits the resultant vector 407 to be written to by four consecutive instructions, each specifying a different DWORD resultant location, so that one vector contains comparison results for 16 different comparisons.

Figure 4B:
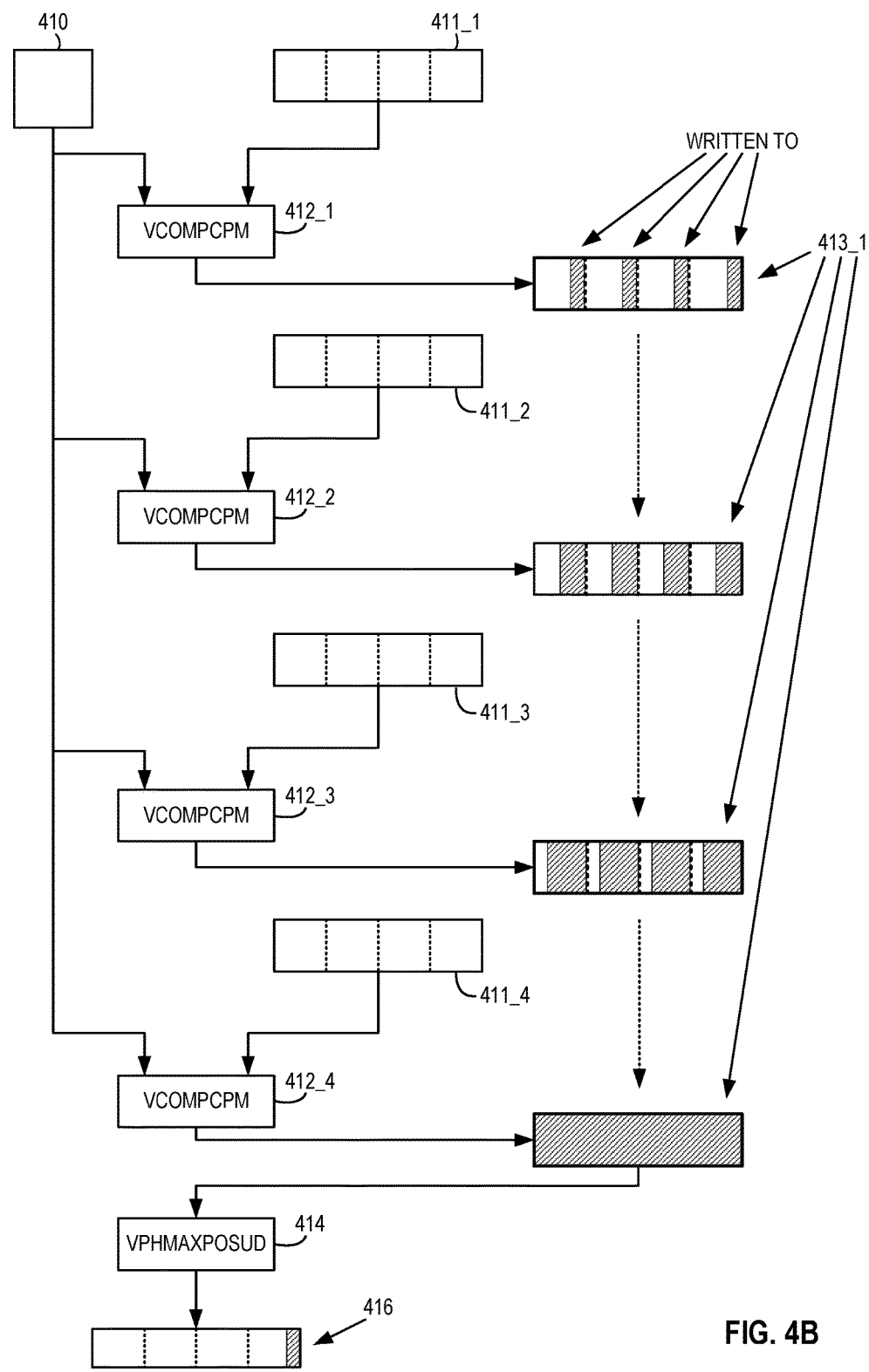
FIG. 4B shows a methodology of a stream of instructions.

FIG. 4B shows the sequence in more detail. As observed in FIG. 4B a first VCOMPCPM instruction 412_1 compares a current data sequence 410 against a first input vector 411_1 of four previous data sequences. The first field of the immediate operand of the first instruction specifies the resultants should be written into the rightmost DWORD (e.g., shown as hatched) of each vector element in the resultant 413_1 of the first instruction.

A second VCOMPCPM instruction 412_2 is next executed that compares the current data sequence 410 against a second input vector 411_2 of four previous data sequences. The immediate operand of the second instruction 412_2, however, specifies the results should be written in the second rightmost DWORD (e.g., shown as additionally hatched) of each vector element in the same destination register (i.e., same resultant 413_1) as the first instruction 412_1. As such, even though the same register is written to having the resultants of the first instruction 412_1, the resultants of the first instruction 412_1 are not overwritten by the resultants of the second instruction 412_2.

The sequence continues for two more VCOMPCPM instructions 412_3, 412_4 with two more different respective input vectors 411_3, 411_4 of four prior data sequences and respective immediate operands that specify third and fourth DWORDS of the resultant 413_1. At the conclusion of the fourth instruction 412_4, the resultant 413_1 contains the results of 16 comparisons against the current input data sequence 410.

After the fourth VCOMPCPM instruction 412_4 is executed another vector instruction VPHMAXPOSUD 414 is executed that accepts the resultant 413_1 of the fourth VCOMPCPM instruction 412_4 as an input vector and views it as a 16 element vector. The VPHMAXPOSUD vector instruction 414 returns a resultant 416 that identifies which of the sixteen comparisons have the highest number of matching data bytes to the input data sequence 410.

Here, the VPHMAXPOSUD instruction 414 is designed to only compare the number of matching byes portion of each of its input vector elements (which recalling from above discussion of FIG. 4A was specified with only 4 bits of the 20 bit comparison resultant) yet returns the entire 20 bit field that specifies both the number of matching bytes and the distance information. The information from the VPH-MAXPOSUD instruction resultant 416 is then used to (directly or indirectly) insert a reference in the place of the data being encoded where the data sequence of input vector 410 belongs.

In additional or alternative implementations the immediate operand field can be enhanced to specify a minimum match length. For example, if the minimum match length is specified to be 3 and a comparison between two 12 byte sequences yields only a two byte sequence match, the resultant for that comparison will be fixed to show no matches.

In an even further embodiment the immediate operand can further specify a minimum match length of 2 or 3 bytes. Here, different encoding implementations may have different criteria for a valid encoding insertion. Enhancing the instruction functional unit logic circuitry to respond to immediate operands specifying different "rules" or "policies" permits the instruction to support a variety of different sliding window encoding implementations. Consistent with this perspective, in another additional or alternative implementation the immediate operand may specify that a mere 3 byte sequence match should be fixed to show no match if the distance between the current data sequence and the previous data sequences exceeds some distance (which, e.g., may be further specified in the immediate operand or hardcoded into the instruction execution logic circuitry).

Figure 5A:
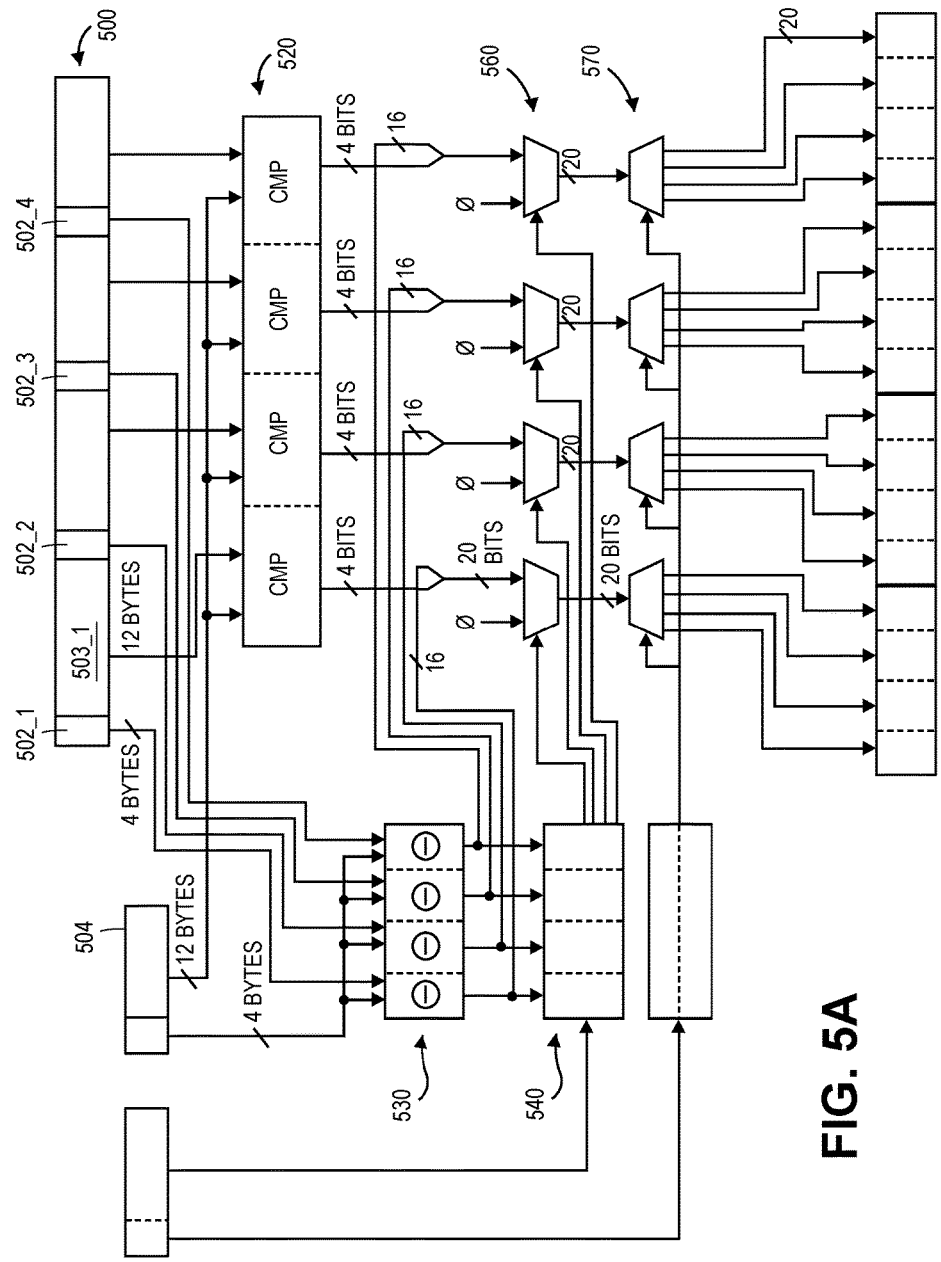
FIGS. 5A and 5B show a circuit design for the instruction of FIGS. 4A and 4B.

FIG. 5A shows a logic circuit design for a functional unit that executes a VCOMPCPM instruction. As observed in FIG. 5A, the functional unit logic circuitry includes a bank of comparison logic circuitry 520 that compares bytes of elements of a first input vector 500 (which may originate from a vector register or from memory) against the bytes of a scalar input 504. An aligned byte by comparison is performed, logically from one end, and the comparison result is deemed to be the number of identical bytes at each byte location until the first pair of non matching bytes is observed.

Difference logic circuitry 530 takes the difference between the location information of the scalar input 504 and the location information 502_1 through 502_4 of the individual elements within the input vector 500. Distance checking logic circuitry 540 confirms that any distance between data sequences as determined by the different logic circuitry 530 does not exceed a maximum distance as specified by a first section 503_1 of an immediate operand. If any particular distance does exceed the maximum distance, distance checking circuitry 540 will force an invalid comparison (or no match) by forcing 0s through the lane of the offending input vector element by way of its corresponding multiplexer in multiplexer bank 560. If a distance is within the maximum, the comparison result from comparison bank 520 and the difference result from difference logic circuitry 530 for a particular input vector 500 element are allowed to pass to a demux circuit of a demux circuit bank 570 for its corresponding lane. The demux circuit routes the result to the appropriate DWORD of its lane as determined by a second section of the immediate operand.

Although not depicted in FIG. 5A, masking layer circuitry may receive a mask vector to entertain input vector 500 sizes of 1, 2, 3 and 4 elements with the corresponding number of difference units, comparison units, muxes and demuxes being enabled/disabled in their respective banks 520, 530, 560, 570.

Figure 5B:
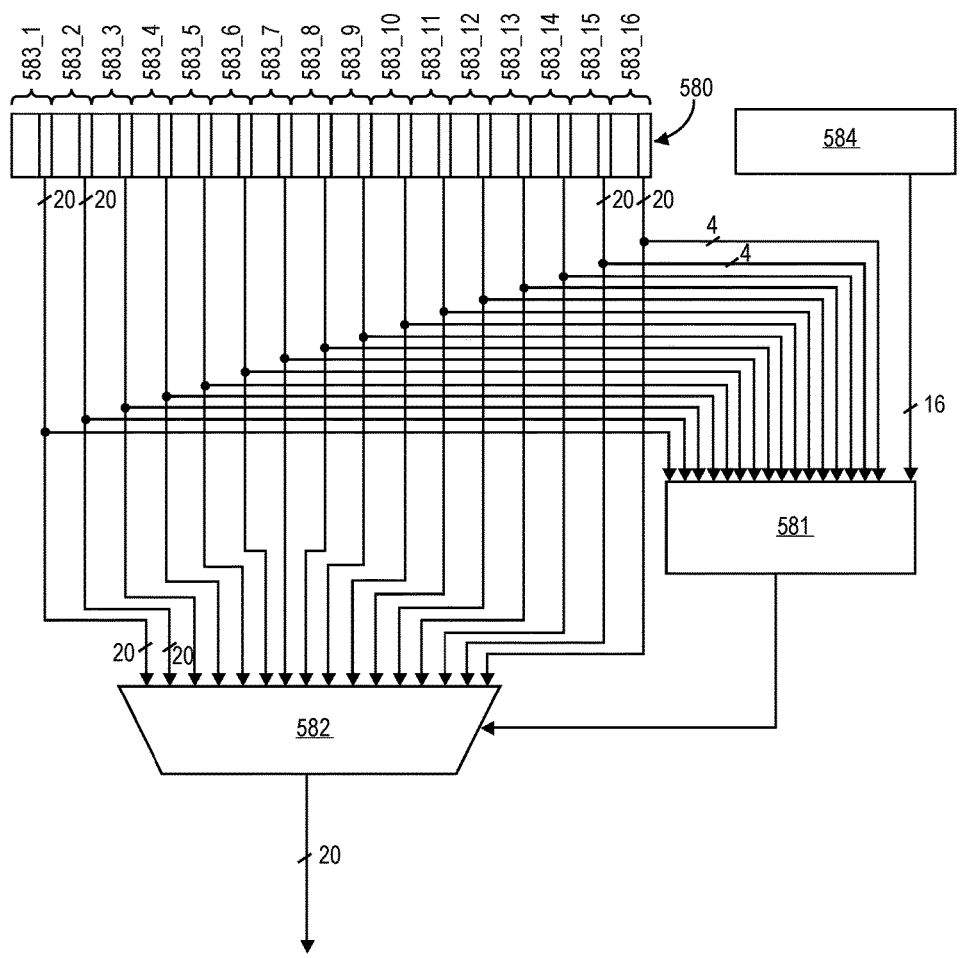

FIG. 5B shows a circuit design for a functional unit that is designed to perform the VPHMAXPOSUD instruction. As observed in FIG. 5B, the logic circuitry accepts an input vector 580 composed of up to 16 elements 583_1 through 583_16 each oriented rightwise in a corresponding DWORD of the input vector. Each element is understood to be 20 bits wide composed of a first field of four bits that identifies a number of matches and 16 bits identifying a distance. Comparison circuitry 581 compares the number of matches data values of the input vector 580 against one another to determine a maximum among them. The input vector element determined to have the maximum number of matches is then selected by a multiplexer 582 controlled by the comparison circuitry output to pass through as the resultant of the instruction. A mask vector input 584 may be used to control the number of match values to be compared in cases where the input vector 580 fields less than 16 input elements.

The input vectors 500, 580 respectively received by the functional units of FIGS. 5A and 5B may be respectively received from vector registers coupled to an instruction execution pipeline having these functional units in an execution stage. Alternatively they may originate from memory. The instruction format may specify whether the vector inputs are to retrieved from vector register space or memory. The scalar input of the functional unit of FIG. 5A may be a true scalar received from scalar (general purpose) register space coupled to the pipeline or may be presented as a single element of an input vector received from vector register space. Input masks may be received from mask register space.

Although specific embodiments above pertain to specific vector sizes, vector elements sizes and resultant sizes (vector element or otherwise), those of ordinary skill will understand these sizes are just approach amongst many other possible sizes.

Embodiments of the instruction(s) detailed above are embodied may be embodied in a "generic vector friendly instruction format" which is detailed below. In other embodiments, such a format is not utilized and another instruction format is used, however, the description below of the writemask registers, various data transformations (swizzle, broadcast, etc.), addressing, etc. is generally applicable to the description of the embodiments of the instruction(s) above. Additionally, exemplary systems, architectures, and pipelines are detailed below. Embodiments of the instruction(s) above may be executed on such systems, architectures, and pipelines, but are not limited to those detailed.

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 6A:
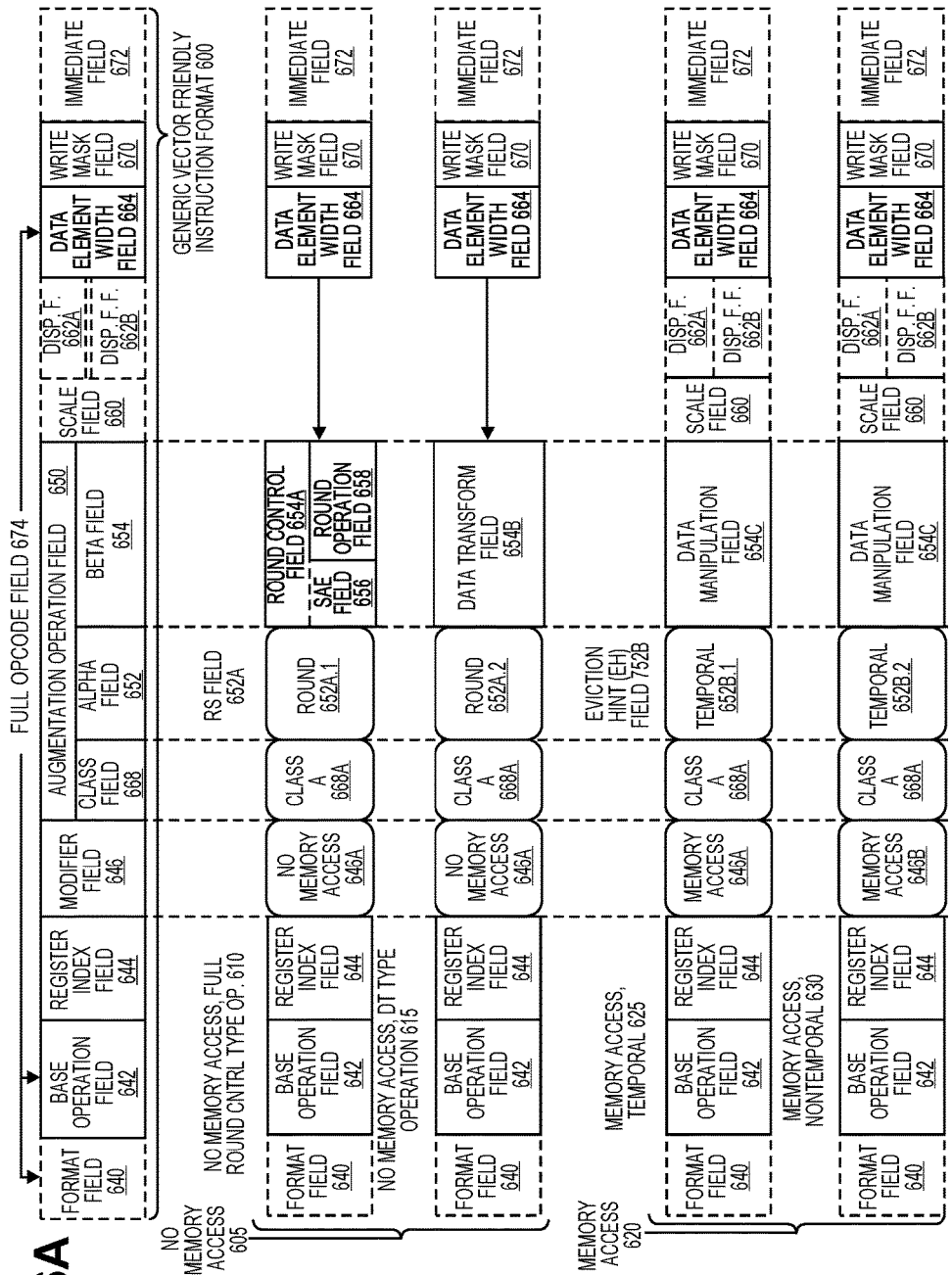
FIG. 6A is a block diagram illustrating a generic vector friendly instruction format and class A instruction templates thereof according to embodiments of the invention.
Figure 6B:
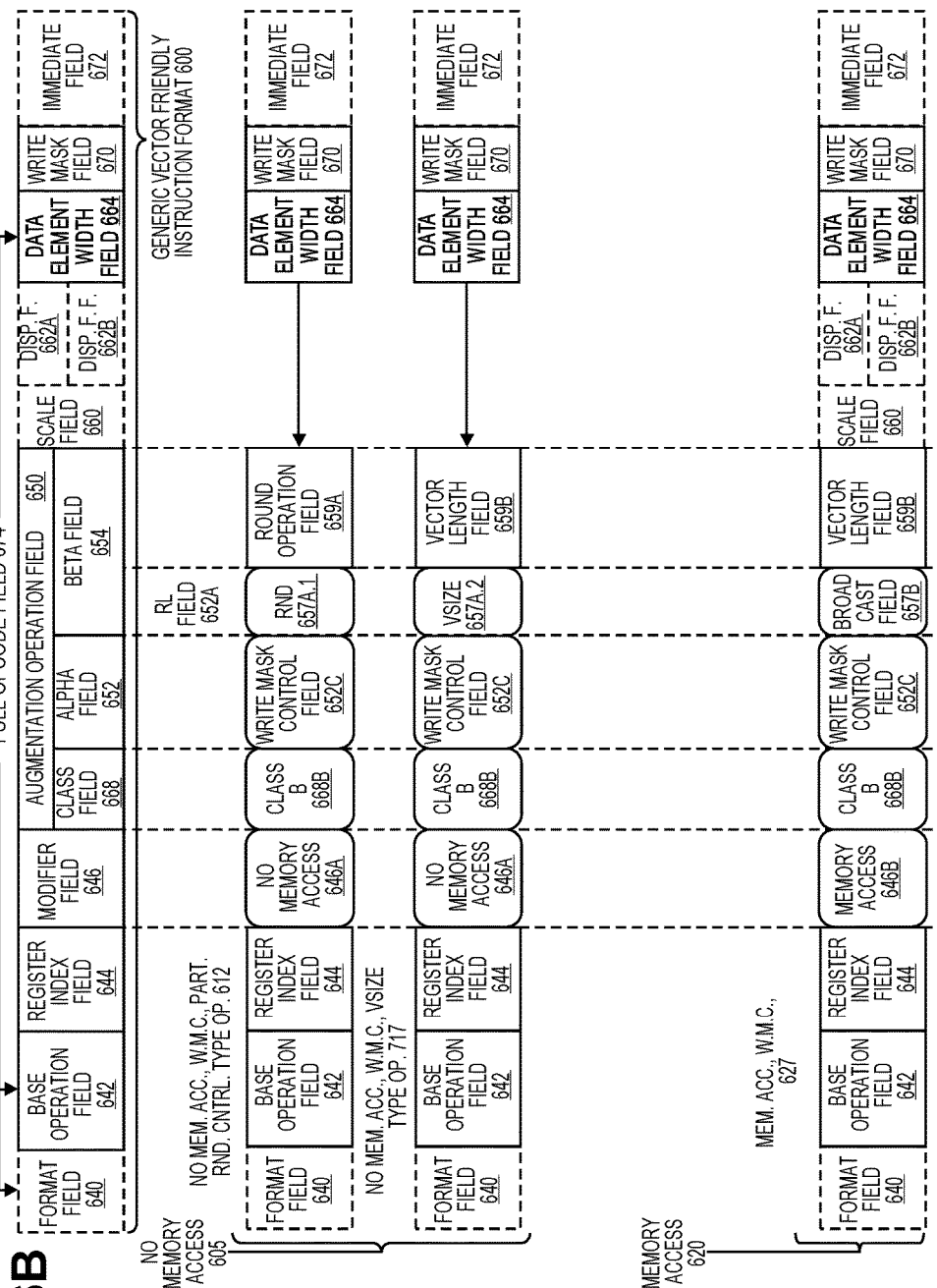
FIG. 6B is a block diagram illustrating the generic vector friendly instruction format and class B instruction templates thereof according to embodiments of the invention.

Exemplary Generic Vector Friendly Instruction Format—FIG. 6A-B

FIGS. 6A-B are block diagrams illustrating a generic vector friendly instruction format and instruction templates thereof according to embodiments of the invention. FIG. 6A is a block diagram illustrating a generic vector friendly instruction format and class A instruction templates thereof according to embodiments of the invention; while FIG. 6B is a block diagram illustrating the generic vector friendly instruction format and class B instruction templates thereof according to embodiments of the invention. Specifically, a generic vector friendly instruction format 600 for which are defined class A and class B instruction templates, both of which include no memory access 605 instruction templates and memory access 620 instruction templates. The term generic in the context of the vector friendly instruction format refers to the instruction format not being tied to any specific instruction set. While embodiments will be described in which instructions in the vector friendly instruction format operate on vectors that are sourced from either registers (no memory access 605 instruction templates) or registers/memory (memory access 620 instruction templates), alternative embodiments of the invention may support only one of these. Also, while embodiments of the invention will be described in which there are load and store instructions in the vector instruction format, alternative embodiments instead or additionally have instructions in a different instruction format that move vectors into and out of registers (e.g., from memory into registers, from registers into memory, between registers). Further, while embodiments of the invention will be described that support two classes of instruction templates, alternative embodiments may support only one of these or more than two.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 656 byte vector operands) with more, less, or different data element widths (e.g., 128 bit (16 byte) data element widths).

The class A instruction templates in FIG. 6A include: 1) within the no memory access 605 instruction templates there is shown a no memory access, full round control type operation 610 instruction template and a no memory access, data transform type operation 615 instruction template; and 2) within the memory access 620 instruction templates there is shown a memory access, temporal 625 instruction template and a memory access, non-temporal 630 instruction template. The class B instruction templates in FIG. 6B include: 1) within the no memory access 605 instruction templates there is shown a no memory access, write mask control, partial round control type operation 612 instruction template and a no memory access, write mask control, vsize type operation 617 instruction template; and 2) within the memory access 620 instruction templates there is shown a memory access, write mask control 627 instruction template.

Format

The generic vector friendly instruction format 600 includes the following fields listed below in the order illustrated in FIGS. 6A-B. In conjunction with the discussions above, in an embodiment, referring to the format details provided below in FIGS. 6A-B and 7, either a non memory access instruction type 605 or a memory access instruction type 620 may be utilized. Addresses for the read mask(s), input vector operand(s) and destination may be identified in register index field 644 described below. In a further embodiment, the write mask is specified in write mask field 670.

Format field 640—a specific value (an instruction format identifier value) in this field uniquely identifies the vector friendly instruction format, and thus occurrences of instructions in the vector friendly instruction format in instruction streams. Thus, the content of the format field 640 distinguish occurrences of instructions in the first instruction format from occurrences of instructions in other instruction formats, thereby allowing for the introduction of the vector friendly instruction format into an instruction set that has other instruction formats. As such, this field is optional in the sense that it is not needed for an instruction set that has only the generic vector friendly instruction format.

Base operation field 642—its content distinguishes different base operations. As described later herein, the base operation field 642 may include and/or be part of an opcode field.

Register index field 644—its content, directly or through address generation, specifies the locations of the source and destination operands, be they in registers or in memory. These include a sufficient number of bits to select N registers from a PxQ (e.g. 32x1012) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination). While in one embodiment P=32, alternative embodiments may support more or less registers (e.g., 16). While in one embodiment Q=1012 bits, alternative embodiments may support more or less bits (e.g., 128, 1024).

Modifier field 646—its content distinguishes occurrences of instructions in the generic vector instruction format that specify memory access from those that do not; that is, between no memory access 605 instruction templates and memory access 620 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 650—its content distinguishes which one of a variety of different operations to be performed in addition to the base operation. This field is context specific. In one embodiment of the invention, this field is divided into a class field 668, an alpha field 652, and a beta field 654. The augmentation operation field allows common groups of operations to be performed in a single instruction rather than 2, 3 or 4 instructions. Below are some examples of instructions (the nomenclature of which are described in more detail later herein) that use the augmentation field 650 to reduce the number of required instructions.

| Prior Instruction Sequences | Instructions Sequences according to on Embodiment of the Invention |
|---|---|
| vaddps ymm0, ymm1, ymm2 | vaddps zmm0, zmm1, zmm2 |
| vpshufd ymm2, ymm2, 0x55 | vaddps zmm0, zmm1, zmm2 {bbbb} |
| vaddps ymm0, ymm1, ymm2 | |
| vpmovsxbd ymm2, [rax] | vaddps zmm0, zmm1, [rax]{sint8} |
| vcvtdq2ps ymm2, ymm2 | |
| vaddps ymm0, ymm1, ymm2 | |
| vpmovsxbd ymm3, [rax] | vaddps zmm1 {k5}, zmm2, |
| vcvtdq2ps ymm3, ymm3 | [rax]{sint8} |
| vaddps ymm4, ymm2, ymm3 | |
| vblendvps ymm1, ymm5, ymm1, ymm4 | |
| vmaskmovps ymm1, ymm7, [rbx] | vmovaps zmm1 {k7}, [rbx] |
| vbroadcastss ymm0, [rax] | vaddps zmm2{k7}{z}, zmm1, |
| vaddps ymm2, ymm0, ymm1 | [rax]{1 to N} |
| vblendvps ymm2, ymm2, ymm1, ymm7 | |

Where [rax] is the base pointer to be used for address generation, and where { } indicates a conversion operation specified by the data manipulation field (described in more detail later here).

Scale field 660—its content allows for the scaling of the index field's content for memory address generation (e.g., for address generation that uses $2^{scale}*index+base$).

Displacement Field 662A—its content is used as part of memory address generation (e.g., for address generation that uses $2^{scale}*index+base+displacement$).

Displacement Factor Field 662B (note that the juxtaposition of displacement field 662A directly over displacement factor field 662B indicates one or the other is used)—its content is used as part of address generation; it specifies a displacement factor that is to be scaled by the size of a memory access (N)—where N is the number of bytes in the memory access (e.g., for address generation that uses $2^{scale}*index+base+scaled\ displacement$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 674 (described later herein) and the data manipulation field 654C as described later herein. The displacement field 662A and the displacement factor field 662B are optional in the sense that they are not used for the no memory access 605 instruction templates and/or different embodiments may implement only one or none of the two.

Data element width field 664—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 670—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 670 allows for partial vector operations, including loads, stores, arithmetic, logical, etc. Also, this masking can be used for fault suppression (i.e., by masking the destination's data element positions to prevent receipt of the result of any operation that may/will cause a fault—e.g., assume that a vector in memory crosses a page boundary and that the first page but not the second page would cause a page fault, the page fault can be ignored if all data element of the vector that lie on the first page are masked by the write mask). Further, write masks allow for "vectorizing loops" that contain certain types of conditional statements. While embodiments of the invention are described in which the write mask field's 670 content selects one of a number of write mask registers that contains the write mask to be used (and thus the write mask field's 670 content indirectly identifies that masking to be performed), alternative embodiments instead or additional allow the mask write field's 670 content to directly specify the masking to be performed. Further, zeroing allows for performance improvements when: 1) register renaming is used on instructions whose destination operand is not also a source (also call non-ternary instructions) because during the register renaming pipeline stage the destination is no longer an implicit source (no data elements from the current destination register need be copied to the renamed destination register or somehow carried along with the operation because any data element that is not the result of operation (any masked data element) will be zeroed); and 2) during the write back stage because zeros are being written.

Figure 2A:
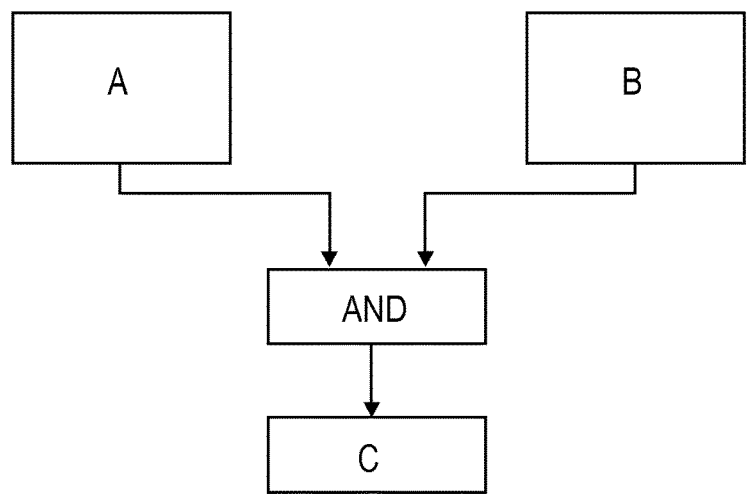
Figure 2B:
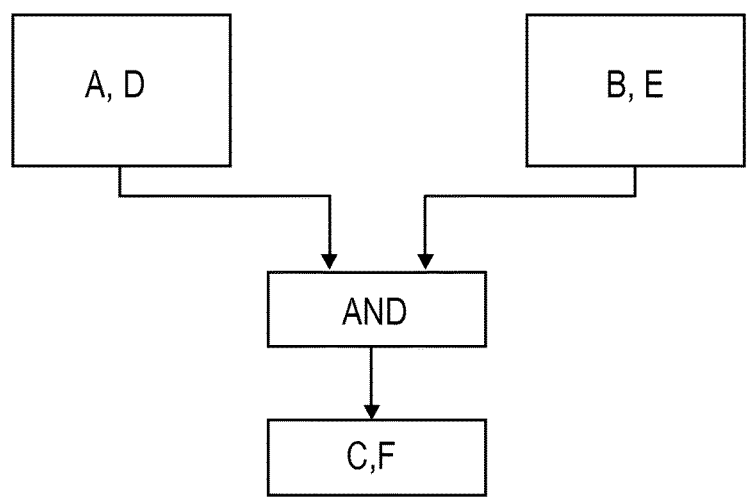

Immediate field 672—its content allows for the specification of an immediate. This field is optional in the sense that is it not present in an implementation of the generic vector friendly format that does not support immediate and it is not present in instructions that do not use an immediate.
Instruction Template Class Selection Class field 668—its content distinguishes between different classes of instructions. With reference to FIGS. 2A-B, the contents of this field select between class A and class B instructions. In FIGS. 6A-B, rounded corner squares are used to indicate a specific value is present in a field (e.g., class A 668A and class B 668B for the class field 668 respectively in FIGS. 6A-B).
No-Memory Access Instruction Templates of Class A In the case of the non-memory access 605 instruction templates of class A, the alpha field 652 is interpreted as an RS field 652A, whose content distinguishes which one of the different augmentation operation types are to be performed (e.g., round 652A.1 and data transform 652A.2 are respectively specified for the no memory access, round type operation 610 and the no memory access, data transform type operation 615 instruction templates), while the beta field 654 distinguishes which of the operations of the specified type is to be performed. In FIG. 6, rounded corner blocks are used to indicate a specific value is present (e.g., no memory access 646A in the modifier field 646; round 652A.1 and data transform 652A.2 for alpha field 652/rs field 652A). In the no memory access 605 instruction templates, the scale field 660, the displacement field 662A, and the displacement factor field 662B are not present.
No-Memory Access Instruction Templates—Full Round Control Type Operation In the no memory access full round control type operation 610 instruction template, the beta field 654 is interpreted as a round control field 654A, whose content(s) provide static rounding. While in the described embodiments of the invention the round control field 654A includes a suppress all floating point exceptions (SAE) field 656 and a round operation control field 658, alternative embodiments may support may encode both these concepts into the same field or only have one or the other of these concepts/fields (e.g., may have only the round operation control field 658).

SAE field 656—its content distinguishes whether or not to disable the exception event reporting; when the SAE field's 656 content indicates suppression is enabled, a given instruction does not report any kind of floating-point exception flag and does not raise any floating point exception handler.

Round operation control field 658—its content distinguishes which one of a group of rounding operations to perform (e.g., Round-up, Round-down, Round-towards-zero and Round-to-nearest). Thus, the round operation control field 658 allows for the changing of the rounding mode on a per instruction basis, and thus is particularly useful when this is required. In one embodiment of the invention where a processor includes a control register for specifying rounding modes, the round operation control field's 650 content overrides that register value (Being able to choose the rounding mode without having to perform a save-modify-restore on such a control register is advantageous).
No Memory Access Instruction Templates—Data Transform Type Operation In the no memory access data transform type operation 615 instruction template, the beta field 654 is interpreted as a data transform field 654B, whose content distinguishes which one of a number of data transforms is to be performed (e.g., no data transform, swizzle, broadcast).
Memory Access Instruction Templates of Class A In the case of a memory access 620 instruction template of class A, the alpha field 652 is interpreted as an eviction hint field 652B, whose content distinguishes which one of the eviction hints is to be used (in FIG. 6A, temporal 652B.1 and non-temporal 652B.2 are respectively specified for the memory access, temporal 625 instruction template and the memory access, non-temporal 630 instruction template), while the beta field 654 is interpreted as a data manipulation field 654C, whose content distinguishes which one of a number of data manipulation operations (also known as primitives) is to be performed (e.g., no manipulation; broadcast; up conversion of a source; and down conversion of a destination). The memory access 620 instruction templates include the scale field 660, and optionally the displacement field 662A or the displacement factor field 662B.

Vector Memory Instructions perform vector loads from and vector stores to memory, with conversion support. As with regular vector instructions, vector memory instructions transfer data from/to memory in a data element-wise fashion, with the elements that are actually transferred dictated by the contents of the vector mask that is selected as the write mask. In FIG. 6A, rounded corner squares are used to indicate a specific value is present in a field (e.g., memory access 646B for the modifier field 646; temporal 652B.1 and non-temporal 652B.2 for the alpha field 652/eviction hint field 652B).

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 652 is interpreted as a write mask control (Z) field 652C, whose content distinguishes whether the write masking controlled by the write mask field 670 should be a merging or a zeroing.

No-Memory Access Instruction Templates of Class B

In the case of the non-memory access 605 instruction templates of class B, part of the beta field 654 is interpreted as an RL field 657A, whose content distinguishes which one of the different augmentation operation types are to be performed (e.g., round 657A.1 and vector length (VSIZE) 657A.2 are respectively specified for the no memory access, write mask control, partial round control type operation 612 instruction template and the no memory access, write mask control, VSIZE type operation 617 instruction template), while the rest of the beta field 654 distinguishes which of the operations of the specified type is to be performed. In FIG. 6, rounded corner blocks are used to indicate a specific value is present (e.g., no memory access 646A in the modifier field 646; round 657A.1 and VSIZE 657A.2 for the RL field 657A). In the no memory access 605 instruction templates, the scale field 660, the displacement field 662A, and the displacement factor field 662B are not present.

No-Memory Access Instruction Templates—Write Mask Control, Partial Round Control Type Operation In the no memory access, write mask control, partial round control type operation 610 instruction template, the rest of the beta field 654 is interpreted as a round operation field 659A and exception event reporting is disabled (a given instruction does not report any kind of floating-point exception flag and does not raise any floating point exception handler).

Round operation control field 659A—just as round operation control field 658, its content distinguishes which one of a group of rounding operations to perform (e.g., Round-up, Round-down, Round-towards-zero and Round-to-nearest). Thus, the round operation control field 659A allows for the changing of the rounding mode on a per instruction basis, and thus is particularly useful when this is required. In one embodiment of the invention where a processor includes a control register for specifying rounding modes, the round operation control field's 650 content overrides that register value (Being able to choose the rounding mode without having to perform a save-modify-restore on such a control register is advantageous).

No Memory Access Instruction Templates—Write Mask Control, VSIZE Type Operation

In the no memory access, write mask control, VSIZE type operation 617 instruction template, the rest of the beta field 654 is interpreted as a vector length field 659B, whose content distinguishes which one of a number of data vector length is to be performed on (e.g., 128, 856, or 1012 byte).

Memory Access Instruction Templates of Class B

In the case of a memory access 620 instruction template of class A, part of the beta field 654 is interpreted as a broadcast field 657B, whose content distinguishes whether or not the broadcast type data manipulation operation is to be performed, while the rest of the beta field 654 is interpreted the vector length field 659B. The memory access 620 instruction templates include the scale field 660, and optionally the displacement field 662A or the displacement scale field 662B.

Additional Comments Regarding Fields

With regard to the generic vector friendly instruction format 600, a full opcode field 674 is shown including the format field 640, the base operation field 642, and the data element width field 664. While one embodiment is shown where the full opcode field 674 includes all of these fields, the full opcode field 674 includes less than all of these fields in embodiments that do not support all of them. The full opcode field 674 provides the operation code.

The augmentation operation field 650, the data element width field 664, and the write mask field 670 allow these features to be specified on a per instruction basis in the generic vector friendly instruction format.

The combination of write mask field and data element width field create typed instructions in that they allow the mask to be applied based on different data element widths.

The instruction format requires a relatively small number of bits because it reuses different fields for different purposes based on the contents of other fields. For instance, one perspective is that the modifier field's content choses between the no memory access 605 instructions templates on FIGS. 6A-B and the memory access 6250 instruction templates on FIGS. 6A-B; while the class field 668's content choses within those non-memory access 605 instruction templates between instruction templates 610/615 of FIG. 6A and 612/617 of FIG. 6B; and while the class field 668's content choses within those memory access 620 instruction templates between instruction templates 625/830 of FIG. 6A and 627 of FIG. 6B. From another perspective, the class field 668's content choses between the class A and class B instruction templates respectively of FIGS. 6A and B; while the modifier field's content choses within those class A instruction templates between instruction templates 605 and 620 of FIG. 6A; and while the modifier field's content choses within those class B instruction templates between instruction templates 605 and 620 of FIG. 6B. In the case of the class field's content indicating a class A instruction template, the content of the modifier field 646 choses the interpretation of the alpha field 652 (between the rs field 652A and the EH field 652B. In a related manner, the contents of the modifier field 646 and the class field 668 chose whether the alpha field is interpreted as the rs field 652A, the EH field 652B, or the write mask control (Z) field 652C. In the case of the class and modifier fields indicating a class A no memory access operation, the interpretation of the augmentation field's beta field changes based on the rs field's content; while in the case of the class and modifier fields indicating a class B no memory access operation, the interpretation of the beta field depends on the contents of the RL field. In the case of the class and modifier fields indicating a class A memory access operation, the interpretation of the augmentation field's beta field changes based on the base operation field's content; while in the case of the class and modifier fields indicating a class B memory access operation, the interpretation of the augmentation field's beta field's broadcast field 657B changes based on the base operation field's contents. Thus, the combination of the base operation field, modifier field and the augmentation operation field allow for an even wider variety of augmentation operations to be specified.

The various instruction templates found within class A and class B are beneficial in different situations. Class A is useful when zeroing-writemasking or smaller vector lengths are desired for performance reasons. For example, zeroing allows avoiding fake dependences when renaming is used since we no longer need to artificially merge with the destination; as another example, vector length control eases store-load forwarding issues when emulating shorter vector sizes with the vector mask. Class B is useful when it is desirable to: 1) allow floating point exceptions (i.e., when the contents of the SAE field indicate no) while using rounding-mode controls at the same time; 2) be able to use upconversion, swizzling, swap, and/or downconversion; 3) operate on the graphics data type. For instance, upconversion, swizzling, swap, downconversion, and the graphics data type reduce the number of instructions required when working with sources in a different format; as another example, the ability to allow exceptions provides full IEEE compliance with directed rounding-modes.

Exemplary Specific Vector Friendly Instruction Format

FIGS. 7A-C show a block diagram illustrating an exemplary specific vector friendly instruction format according to embodiments of the invention. FIGS. 7A-C show a specific vector friendly instruction format 700 that is specific in the sense that it specifies the location, size, interpretation, and order of the fields, as well as values for some of those fields. The specific vector friendly instruction format 700 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 6 into which the fields from FIGS. 7A-C map are illustrated.

It should be understand that although embodiments of the invention are described with reference to the specific vector friendly instruction format 700 in the context of the generic vector friendly instruction format 600 for illustrative purposes, the invention is not limited to the specific vector friendly instruction format 700 except where claimed. For example, the generic vector friendly instruction format 600 contemplates a variety of possible sizes for the various fields, while the specific vector friendly instruction format 700 is shown as having fields of specific sizes. By way of specific example, while the data element width field 664 is illustrated as a one bit field in the specific vector friendly instruction format 700, the invention is not so limited (that is, the generic vector friendly instruction format 600 contemplates other sizes of the data element width field 664).

Format—FIGS. 7A-C

The generic vector friendly instruction format 600 includes the following fields listed below in the order illustrated in FIGS. 7A-C.

EVEX Prefix (Bytes 0-3)

EVEX Prefix 702—is encoded in a four-byte form.

Format Field 640 (EVEX Byte 0, bits [7:0])—the first byte (EVEX Byte 0) is the format field 640 and it contains 0x62 (the unique value used for distinguishing the vector friendly instruction format in one embodiment of the invention).

The second-fourth bytes (EVEX Bytes 1-3) include a number of bit fields providing specific capability.

REX field 705 (EVEX Byte 1, bits [7-5])—consists of a EVEX.R bit field (EVEX Byte 1, bit [7]—R), EVEX.X bit field (EVEX byte 1, bit [6]—X), and 657BEX byte 1, bit[5]—B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 710—this is the first part of the REX' field 710 and is the EVEX.R' bit field (EVEX Byte 1, bit [4]—R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 715 (EVEX byte 1, bits [3:0]—mmmm)—its content encodes an implied leading opcode byte (0F, 0F 38, or 0F 3).

Data element width field 664 (EVEX byte 2, bit [7]—W)—is represented by the notation EVEX.W. EVEX.W is used to define the granularity (size) of the datatype (either 32-bit data elements or 64-bit data elements).

EVEX.vvvv 720 (EVEX Byte 2, bits [6:3]—vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 720 encodes the 4 low-order bits of the first source register specifier stored in inverted (1s complement) form. Depending on the instruction, an extra different EVEX bit field is used to extend the specifier size to 32 registers.

EVEX.U 668 Class field (EVEX byte 2, bit [2]—U)—If EVEX.U=0, it indicates class A or EVEX.U0; if EVEX.U=1, it indicates class B or EVEX.U1.

Prefix encoding field 725 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 652 (EVEX byte 3, bit [7]—EH; also known as EVEX.EH, EVEX.rs, EVEX.RL, EVEX.write mask control, and EVEX.N; also illustrated with α)—as previously described, this field is context specific. Additional description is provided later herein.

Beta field 654 (EVEX byte 3, bits [6:4]—SSS, also known as $EVEX.s_{2-0}$, $EVEX.r_{2-0}$, EVEX.rr1, EVEX.LL0, EVEX.LLB; also illustrated with βββ)—as previously described, this field is context specific. Additional description is provided later herein.

REX' field 710—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 670 (EVEX byte 3, bits [2:0]—kkk)—its content specifies the index of a register in the write mask registers as previously described. In one embodiment of the invention, the specific value EVEX kkk=000 has a special behavior implying no write mask is used for the particular instruction (this may be implemented in a variety of ways including the use of a write mask hardwired to all ones or hardware that bypasses the masking hardware).

Real Opcode Field 730 (Byte 4)

This is also known as the opcode byte. Part of the opcode is specified in this field. MOD R/M Field 740 (Byte 5)

Modifier field 646 (MODR/M.MOD, bits [7-6]—MOD field 742)—As previously described, the MOD field's 742 content distinguishes between memory access and non-memory access operations. This field will be further described later herein.

MODR/M.reg field 744, bits [5-3]—the role of ModR/M.reg field can be summarized to two situations: ModR/M.reg encodes either the destination register operand or a source register operand, or ModR/M.reg is treated as an opcode extension and not used to encode any instruction operand.

MODR/M.r/m field 746, bits [2-0]—The role of ModR/M.r/m field may include the following: ModR/M.r/m encodes the instruction operand that references a memory address, or ModR/M.r/m encodes either the destination register operand or a source register operand.

Scale, Index, Base (SIB) Byte (Byte 6)

Scale field 660 (SIB.SS, bits [7-6]—As previously described, the scale field's 660 content is used for memory address generation. This field will be further described later herein.

SIB.xxx 754 (bits [5-3] and SIB.bbb 756 (bits [2-0])—the contents of these fields have been previously referred to with regard to the register indexes Xxxx and Bbbb.

Displacement Byte(s) (Byte 7 or Bytes 7-10)

Displacement field 662A (Bytes 7-10)—when MOD field 742 contains 10, bytes 7-10 are the displacement field 662A, and it works the same as the legacy 32-bit displacement (disp32) and works at byte granularity.

Displacement factor field 662B (Byte 7)—when MOD field 742 contains 01, byte 7 is the displacement factor field 662B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 662B is a reinterpretation of disp8; when using displacement factor field 662B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 662B substitutes the legacy x86 instruction set 8-bit displacement. Thus, the displacement factor field 662B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset).

Immediate

Immediate field 672 operates as previously described.

Exemplary Register Architecture—FIG. 8

FIG. 8 is a block diagram of a register architecture 800 according to one embodiment of the invention. The register files and registers of the register architecture are listed below:

Vector register file 810—in the embodiment illustrated, there are 32 vector registers that are 812 bits wide; these registers are referenced as zmm0 through zmm31. The lower order 656 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 700 operates on these overlaid register file as illustrated in the below tables.

| Adjustable Vector Length | Class | Operations | Registers |
| --- | --- | --- | --- |
| Instruction Templates that do not include the vector length field 659B | A (FIG. 6A; U = 0) | 810, 615, 625, 630 | zmm registers (the vector length is 64 byte) |
| | B (FIG. 6B; U = 1) | 812 | zmm registers (the vector length is 64 byte) |
| Instruction Templates that do include the vector length field 659B | B (FIG. 6B; U = 1) | 817, 627 | zmm, ymm, or xmm registers (the vector length is 64 byte, 32 byte, or 16 byte) depending on the vector length field 659B |

In other words, the vector length field 659B selects between a maximum length and one or more other shorter lengths, where each such shorter length is half the length of the preceding length; and instructions templates without the vector length field 659B operate on the maximum vector length. Further, in one embodiment, the class B instruction templates of the specific vector friendly instruction format 700 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 815—in the embodiment illustrated, there are 8 write mask registers (k0 through k7), each 64 bits in size. As previously described, in one embodiment of the invention the vector mask register k0 cannot be used as a write mask; when the encoding that would normally indicate k0 is used for a write mask, it selects a hardwired write mask of 0xFFFF, effectively disabling write masking for that instruction.

Multimedia Extensions Control Status Register (MXCSR) 820—in the embodiment illustrated, this 32-bit register provides status and control bits used in floating-point operations.

General-purpose registers 825—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Extended flags (EFLAGS) register 830—in the embodiment illustrated, this 32 bit register is used to record the results of many instructions.

Floating Point Control Word (FCW) register 840 and Floating Point Status Word (FSW) register 835—in the embodiment illustrated, these registers are used by x87 instruction set extensions to set rounding modes, exception masks and flags in the case of the FCW, and to keep track of exceptions in the case of the FSW.

Scalar floating point stack register file (x87 stack) 845 on which is aliased the MMX packed integer flat register file 850—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Segment registers 855—in the illustrated embodiment, there are six 16 bit registers use to store data used for segmented address generation.

RIP register 865—in the illustrated embodiment, this 64 bit register that stores the instruction pointer.

Alternative embodiments of the invention may use wider or narrower registers. Additionally, alternative embodiments of the invention may use more, less, or different register files and registers.

Exemplary In-Order Processor Architecture—FIGS. 9A-9B

FIGS. 9A-B illustrate a block diagram of an exemplary in-order processor architecture. These exemplary embodiments are designed around multiple instantiations of an in-order CPU core that is augmented with a wide vector processor (VPU). Cores communicate through a high-bandwidth interconnect network with some fixed function logic, memory I/O interfaces, and other necessary I/O logic, depending on the e13t application. For example, an implementation of this embodiment as a stand-alone GPU would typically include a PCIe bus.

FIG. 9A is a block diagram of a single CPU core, along with its connection to the on-die interconnect network 902 and with its local subset of the level 2 (L2) cache 904, according to embodiments of the invention. An instruction decoder 900 supports the x86 instruction set with an extension including the specific vector instruction format 700. While in one embodiment of the invention (to simplify the design) a scalar unit 908 and a vector unit 910 use separate register sets (respectively, scalar registers 912 and vector registers 914) and data transferred between them is written to memory and then read back in from a level 1 (L1) cache 906, alternative embodiments of the invention may use a different approach (e.g., use a single register set or include a communication path that allow data to be transferred between the two register files without being written and read back).

The L1 cache 906 allows low-latency accesses to cache memory into the scalar and vector units. Together with load-op instructions in the vector friendly instruction format, this means that the L1 cache 906 can be treated somewhat like an extended register file. This significantly improves the performance of many algorithms, especially with the eviction hint field 652B.

The local subset of the L2 cache 904 is part of a global L2 cache that is divided into separate local subsets, one per CPU core. Each CPU has a direct access path to its own local subset of the L2 cache 904. Data read by a CPU core is stored in its L2 cache subset 904 and can be accessed quickly, in parallel with other CPUs accessing their own local L2 cache subsets. Data written by a CPU core is stored in its own L2 cache subset 904 and is flushed from other subsets, if necessary. The ring network ensures coherency for shared data.

FIG. 9B is an exploded view of part of the CPU core in FIG. 9A according to embodiments of the invention. FIG. 9B includes an L1 data cache 906A part of the L1 cache 904, as well as more detail regarding the vector unit 910 and the vector registers 914. Specifically, the vector unit 910 is a 16-wide vector processing unit (VPU) (see the 16-wide ALU 928), which executes integer, single-precision float, and double-precision float instructions. The VPU supports swizzling the register inputs with swizzle unit 920, numeric conversion with numeric convert units 922A-B, and replication with replication unit 924 on the memory input. Write mask registers 926 allow predicating the resulting vector writes.

Register data can be swizzled in a variety of ways, e.g. to support matrix multiplication. Data from memory can be replicated across the VPU lanes. This is a common operation in both graphics and non-graphics parallel data processing, which significantly increases the cache efficiency.

The ring network is bi-directional to allow agents such as CPU cores, L2 caches and other logic blocks to communicate with each other within the chip. Each ring data-path is 812-bits wide per direction.

Exemplary Out-Of-Order Architecture—FIG. 10

Figure 1:
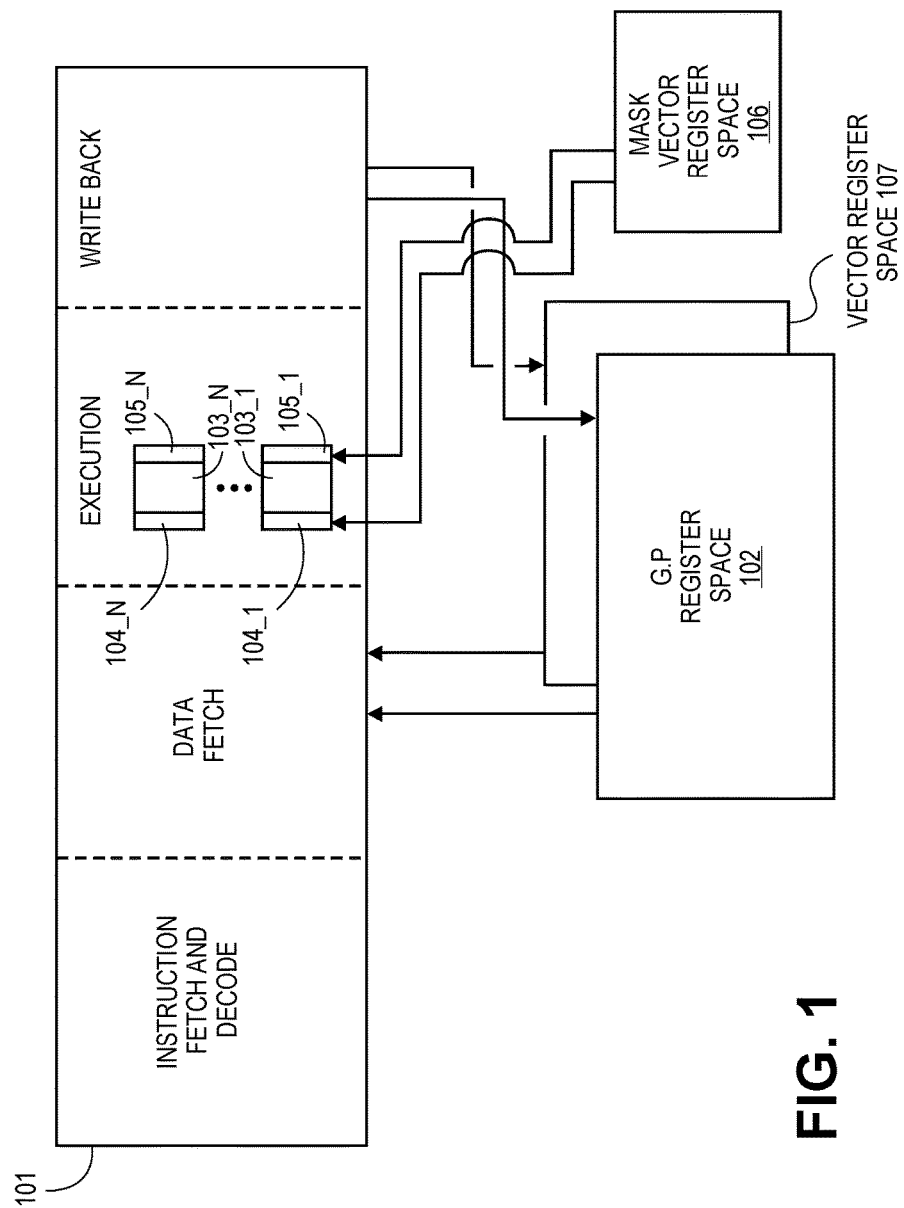

FIG. 10 is a block diagram illustrating an exemplary out-of-order architecture according to embodiments of the invention and can be viewed as a more specific description of a pipeline such as the pipeline discussed above in FIG. 1. Specifically, FIG. 10 illustrates a well-known exemplary out-of-order architecture that has been modified to incorporate the vector friendly instruction format and execution thereof. In FIG. 10 arrows denotes a coupling between two or more units and the direction of the arrow indicates a direction of data flow between those units. FIG. 10 includes a front end unit 1005 coupled to an execution engine unit 1010 and a memory unit 1015; the execution engine unit 1010 is further coupled to the memory unit 1015.

The front end unit 1005 includes a level 1 (L1) branch prediction unit 1020 coupled to a level 2 (L2) branch prediction unit 1022. The L1 and L2 brand prediction units 1020 and 1022 are coupled to an L1 instruction cache unit 1024. The L1 instruction cache unit 1024 is coupled to an instruction translation lookaside buffer (TLB) 1026 which is further coupled to an instruction fetch and predecode unit 1028. The instruction fetch and predecode unit 1028 is coupled to an instruction queue unit 1030 which is further coupled a decode unit 1032. The decode unit 1032 comprises a complex decoder unit 1034 and three simple decoder units 1036, 1038, and 1040. The decode unit 1032 includes a micro-code ROM unit 1042. The decode unit 1032 may operate as previously described above in the decode stage section. The L1 instruction cache unit 1024 is further coupled to an L2 cache unit 1048 in the memory unit 1015. The instruction TLB unit 1026 is further coupled to a second level TLB unit 1046 in the memory unit 1015. The decode unit 1032, the micro-code ROM unit 1042, and a loop stream detector unit 1044 are each coupled to a rename/allocator unit 1056 in the execution engine unit 1010.

The execution engine unit 1010 includes the rename/allocator unit 1056 that is coupled to a retirement unit 1074 and a unified scheduler unit 1058. The retirement unit 1074 is further coupled to execution units 1060 and includes a reorder buffer unit 1078. The unified scheduler unit 1058 is further coupled to a physical register files unit 1076 which is coupled to the execution units 1060. The physical register files unit 1076 comprises a vector registers unit 1077A, a write mask registers unit 1077B, and a scalar registers unit 1077C; these register units may provide the vector registers 810, the vector mask registers 815, and the general purpose registers 825; and the physical register files unit 1076 may include additional register files not shown (e.g., the scalar floating point stack register file 845 aliased on the MMX packed integer flat register file 850). The execution units 1060 include three mixed scalar and vector units 1062, 1064, and 1072; a load unit 1066; a store address unit 1068; a store data unit 1070. The load unit 1066, the store address unit 1068, and the store data unit 1070 are each coupled further to a data TLB unit 1052 in the memory unit 1015.

The memory unit 1015 includes the second level TLB unit 1046 which is coupled to the data TLB unit 1052. The data TLB unit 1052 is coupled to an L1 data cache unit 1054. The L1 data cache unit 1054 is further coupled to an L2 cache unit 1048. In some embodiments, the L2 cache unit 1048 is further coupled to L3 and higher cache units 1050 inside and/or outside of the memory unit 1015.

By way of example, the exemplary out-of-order architecture may implement the process pipeline 8200 as follows: 1) the instruction fetch and predecode unit 1028 perform the fetch and length decoding stages; 2) the decode unit 1032 performs the decode stage; 3) the rename/allocator unit 1056 performs the allocation stage and renaming stage; 4) the unified scheduler 1058 performs the schedule stage; 5) the physical register files unit 1076, the reorder buffer unit 1078, and the memory unit 1015 perform the register read/memory read stage; the execution units 1060 perform the execute/data transform stage; 6) the memory unit 1015 and the reorder buffer unit 1078 perform the write back/memory write stage 1960; 7) the retirement unit 1074 performs the ROB read stage; 8) various units may be involved in the exception handling stage; and 9) the retirement unit 1074 and the physical register files unit 1076 perform the commit stage.

Exemplary Single Core and Multicore Processors—FIG. 15

FIG. 15 is a block diagram of a single core processor and a multicore processor 1500 with integrated memory controller and graphics according to embodiments of the invention. The solid lined boxes in FIG. 15 illustrate a processor 1500 with a single core 1502A, a system agent 1510, a set of one or more bus controller units 1516, while the optional addition of the dashed lined boxes illustrates an alternative processor 1500 with multiple cores 1502A-N, a set of one or more integrated memory controller unit(s) 1514 in the system agent unit 1510, and an integrated graphics logic 1508.

The memory hierarchy includes one or more levels of cache (1504A-1504N) within the cores, a set or one or more shared cache units 1506, and external memory (not shown) coupled to the set of integrated memory controller units 1514. The set of shared cache units 1506 may include one or more mid-level caches, such as level 2 (L2), level 3 (L3), level 4 (L4), or other levels of cache, a last level cache (LLC), and/or combinations thereof. While in one embodiment a ring based interconnect unit 1512 interconnects the integrated graphics logic 1508, the set of shared cache units 1506, and the system agent unit 1510, alternative embodiments may use any number of well-known techniques for interconnecting such units.

In some embodiments, one or more of the cores 1502A-N are capable of multi-threading. The system agent 1510 includes those components coordinating and operating cores 1502A-N. The system agent unit 1510 may include for example a power control unit (PCU) and a display unit. The PCU may be or include logic and components needed for regulating the power state of the cores 1502A-N and the integrated graphics logic 1508. The display unit is for driving one or more externally connected displays.

The cores 1502A-N may be homogenous or heterogeneous in terms of architecture and/or instruction set. For example, some of the cores 1502A-N may be in order (e.g., like that shown in FIGS. 9A and 9B) while others are out-of-order (e.g., like that shown in FIG. 10). As another example, two or more of the cores 1502A-N may be capable of executing the same instruction set, while others may be capable of executing only a subset of that instruction set or a different instruction set. At least one of the cores is capable of executing the vector friendly instruction format described herein.

The processor may be a general-purpose processor, such as a Core™ i3, i5, i7, 2 Duo and Quad, Xeon™, or Itanium™ processor, which are available from Intel Corporation, of Santa Clara, Calif. Alternatively, the processor may be from another company. The processor may be a special-purpose processor, such as, for example, a network or communication processor, compression engine, graphics processor, co-processor, embedded processor, or the like. The processor may be implemented on one or more chips. The processor 1500 may be a part of and/or may be implemented on one or more substrates using any of a number of process technologies, such as, for example, BiCMOS, CMOS, or NMOS.

Exemplary Computer Systems and Processors—FIGS. 11-13

FIGS. 11-13 are exemplary systems suitable for including the processor 1500, while FIG. 14 is an exemplary system on a chip (SoC) that may include one or more of the cores 1502. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 11, shown is a block diagram of a system 1100 in accordance with one embodiment of the invention. The system 1100 may include one or more processors 1110, 1115, which are coupled to graphics memory controller hub (GMCH) 1120. The optional nature of additional processors 1115 is denoted in FIG. 11 with broken lines.

Each processor 1110, 1115 may be some version of processor 1500. However, it should be noted that it is unlikely that integrated graphics logic and integrated memory control units would exist in the processors 1110, 1115.

FIG. 11 illustrates that the GMCH 1120 may be coupled to a memory 1140 that may be, for example, a dynamic random access memory (DRAM). The DRAM may, for at least one embodiment, be associated with a non-volatile cache.

The GMCH 1120 may be a chipset, or a portion of a chipset. The GMCH 1120 may communicate with the processor(s) 1110, 1115 and control interaction between the processor(s) 1110, 1115 and memory 1140. The GMCH 1120 may also act as an accelerated bus interface between the processor(s) 1110, 1115 and other elements of the system 1100. For at least one embodiment, the GMCH 1120 communicates with the processor(s) 1110, 1115 via a multi-drop bus, such as a frontside bus (FSB) 1195.

Furthermore, GMCH 1120 is coupled to a display 1145 (such as a flat panel display). GMCH 1120 may include an integrated graphics accelerator. GMCH 1120 is further coupled to an input/output (I/O) controller hub (ICH) 1150, which may be used to couple various peripheral devices to system 1100. Shown for example in the embodiment of FIG. 11 is an external graphics device 1160, which may be a discrete graphics device coupled to ICH 1150, along with another peripheral device 1170.

Alternatively, additional or different processors may also be present in the system 1100. For example, additional processor(s) 1115 may include additional processors(s) that are the same as processor 1110, additional processor(s) that are heterogeneous or asymmetric to processor 1110, accelerators (such as, e.g., graphics accelerators or digital signal processing (DSP) units), field programmable gate arrays, or any other processor. There can be a variety of differences between the physical resources 1110, 1115 in terms of a spectrum of metrics of merit including architectural, micro-architectural, thermal, power consumption characteristics, and the like. These differences may effectively manifest themselves as asymmetry and heterogeneity amongst the processing elements 1110, 1115. For at least one embodiment, the various processing elements 1110, 1115 may reside in the same die package.

Referring now to FIG. 12, shown is a block diagram of a second system 1200 in accordance with an embodiment of the present invention. As shown in FIG. 12, multiprocessor system 1200 is a point-to-point interconnect system, and includes a first processor 1270 and a second processor 1280 coupled via a point-to-point interconnect 1250. As shown in FIG. 12, each of processors 1270 and 1280 may be some version of the processor 1500.

Alternatively, one or more of processors 1270, 1280 may be an element other than a processor, such as an accelerator or a field programmable gate array.

While shown with only two processors 1270, 1280, it is to be understood that the scope of the present invention is not so limited. In other embodiments, one or more additional processing elements may be present in a given processor.

Processor 1270 may further include an integrated memory controller hub (IMC) 1272 and point-to-point (P-P) interfaces 1276 and 1278. Similarly, second processor 1280 may include a IMC 1282 and P-P interfaces 1286 and 1288. Processors 1270, 1280 may exchange data via a point-to-point (PtP) interface 1250 using PtP interface circuits 1278, 1288. As shown in FIG. 12, IMC's 1272 and 1282 couple the processors to respective memories, namely a memory 1232 and a memory 1234, which may be portions of main memory locally attached to the respective processors.

Processors 1270, 1280 may each exchange data with a chipset 1290 via individual P-P interfaces 1252, 1254 using point to point interface circuits 1276, 1294, 1286, 1298. Chipset 1290 may also exchange data with a high-performance graphics circuit 1238 via a high-performance graphics interface 1292.

A shared cache (not shown) may be included in either processor outside of both processors, yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present invention is not so limited.

As shown in FIG. 12, various I/O devices 1214 may be coupled to first bus 1216, along with a bus bridge 1218 which couples first bus 1216 to a second bus 1220. In one embodiment, second bus 1220 may be a low pin count (LPC) bus. Various devices may be coupled to second bus 1220 including, for example, a keyboard/mouse 1222, communication devices 1226 and a data storage unit 1228 such as a disk drive or other mass storage device which may include code 1230, in one embodiment. Further, an audio I/O 1224 may be coupled to second bus 1220. Note that other architectures are possible. For example, instead of the point-to-point architecture of FIG. 12, a system may implement a multi-drop bus or other such architecture.

Referring now to FIG. 13, shown is a block diagram of a third system 1300 in accordance with an embodiment of the present invention. Like elements in FIGS. 12 and 13 bear like reference numerals, and certain aspects of FIG. 12 have been omitted from FIG. 13 in order to avoid obscuring other aspects of FIG. 13.

FIG. 13 illustrates that the processing elements 1270, 1280 may include integrated memory and I/O control logic ("CL") 1372 and 1382, respectively. For at least one embodiment, the CL 1372, 1382 may include memory controller hub logic (IMC) such as that described above in connection with FIGS. 11 and 12. In addition. CL 1372, 1382 may also include I/O control logic. FIG. 13 illustrates that not only are the memories 1232, 1234 coupled to the CL 1372, 1382, but also that I/O devices 1314 are also coupled to the control logic 1372, 1382. Legacy I/O devices 1315 are coupled to the chipset 1290.

Referring now to FIG. 14, shown is a block diagram of a SoC 1400 in accordance with an embodiment of the present invention. Similar elements in FIG. 15 bear like reference numerals. Also, dashed lined boxes are optional features on more advanced SoCs. In FIG. 14, an interconnect unit(s) 1402 is coupled to: an application processor 1410 which includes a set of one or more cores 1402A-N, which include cache unit(s) 1404A-N, and shared cache unit(s) 1406; a system agent unit 1412; a bus controller unit(s) 1416; an integrated memory controller unit(s) 1414; a set or one or more media processors 1420 which may include integrated graphics logic 1408, an image processor 1424 for providing still and/or video camera functionality, an audio processor 1426 for providing hardware audio acceleration, and a video processor 1428 for providing video encode/decode acceleration; an static random access memory (SRAM) unit 1430; a direct memory access (DMA) unit 1432; and a display unit 1440 for coupling to one or more external displays.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code may be applied to input data to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks (compact disk read-only memories (CD-ROMs), compact disk rewritables (CD-RWs)), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the invention also include non-transitory, tangible machine-readable media containing instructions the vector friendly instruction format or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 16 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 16 shows a program in a high level language 1602 may be compiled using an x86 compiler 1604 to generate x86 binary code 1606 that may be natively executed by a processor with at least one x86 instruction set core 1616 (it is assume that some of the instructions that were compiled are in the vector friendly instruction format). The processor with at least one x86 instruction set core 1616 represents any processor that can perform substantially the same functions as an Intel® processor with at least one x86 instruction set core by compatibly executing or otherwise processing (1) a substantial portion of the instruction set of the Intel® x86 instruction set core or (2) object code versions of applications or other software targeted to run on an Intel® processor with at least one x86 instruction set core, in order to achieve substantially the same result as an Intel® processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 16 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

Certain operations of the instruction(s) in the vector friendly instruction format disclosed herein may be performed by hardware components and may be embodied in machine-executable instructions that are used to cause, or at least result in, a circuit or other hardware component programmed with the instructions performing the operations. The circuit may include a general-purpose or special-purpose processor, or logic circuit, to name just a few examples. The operations may also optionally be performed by a combination of hardware and software. Execution logic and/or a processor may include specific or particular circuitry or other logic responsive to a machine instruction or one or more control signals derived from the machine instruction to store an instruction specified result operand. For example, embodiments of the instruction(s) disclosed herein may be executed in one or more the systems of FIGS. 11-16 and embodiments of the instruction(s) in the vector friendly instruction format may be stored in program code to be executed in the systems. Additionally, the processing elements of these figures may utilize one of the detailed pipelines and/or architectures (e.g., the in-order and out-of-order architectures) detailed herein. For example, the decode unit of the in-order architecture may decode the instruction(s), pass the decoded instruction to a vector or scalar unit, etc.

The above description is intended to illustrate preferred embodiments of the present invention. From the discussion above it should also be apparent that especially in such an area of technology, where growth is fast and further advancements are not easily foreseen, the invention can may be modified in arrangement and detail by those skilled in the art without departing from the principles of the present invention within the scope of the accompanying claims and their equivalents. For example, one or more operations of a method may be combined or further broken apart.

Alternative Embodiments

While embodiments have been described which would natively execute the vector friendly instruction format, alternative embodiments of the invention may execute the vector friendly instruction format through an emulation layer running on a processor that executes a different instruction set (e.g., a processor that executes the MIPS instruction set of MIPS Technologies of Sunnyvale, Calif., a processor that executes the ARM instruction set of ARM Holdings of Sunnyvale, Calif.). Also, while the flow diagrams in the figures show a particular order of operations performed by certain embodiments of the invention, it should be understood that such order is exemplary (e.g., alternative embodiments may perform the operations in a different order, combine certain operations, overlap certain operations, etc.).

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate embodiments of the invention. The scope of the invention is not to be determined by the specific examples provided above but only by the claims below.

The invention claimed is:

1. A method comprising:
   decoding a plurality of instructions into a decoded plurality of instructions; and
   executing the decoded plurality of instructions, each of said decoded plurality of instructions receiving an input value having a first section to store a location of a byte sequence within data and a second section to store the byte sequence of said data, each of said decoded plurality of instructions having a respective input vector, of multiple input vectors, having multiple elements each having a first section to store a respective location of a respective byte sequence within said data and a second section to store the respective byte sequence of said data, each of said decoded plurality of instructions causing different sections of a same resultant vector register to be written into with their respective results without overwriting a result of another of said decoded plurality of instructions, each of said respective results providing a distance and number of matches between said input value and elements of a respective one of said multiple input vectors.

2. The method of claim 1, further comprising decoding a second instruction into a decoded second instruction, and executing the decoded second instruction, after said decoded plurality of instructions have executed, that determines a maximum number of matches within said same resultant vector register.

3. The method of claim 1, wherein each of said plurality of instructions decoded into the decoded plurality of instructions has an instruction format that includes an immediate operand that specifies a maximum permissible distance between said input value and said elements of said respective input vector within said data.

4. The method of claim 1, wherein each of said plurality of instructions decoded into the decoded plurality of instructions has an instruction format that includes an immediate operand that specifies where resultant information is to be written within said same resultant vector register.

5. The method of claim 1, wherein results of a first instruction of the decoded plurality of instructions are written into a first section of each respective vector element of the same resultant vector register, and results of a second instruction of the decoded plurality of instructions are written into a second, different section of each respective vector element of the same resultant vector register without overwriting the results of the first instruction.

6. The method of claim 5, wherein results of a third instruction of the decoded plurality of instructions are written into a third, different section of each respective vector element of the same resultant vector register without overwriting the results of the first instruction and without overwriting the results of the second instruction.

7. The method of claim 6, wherein results of a fourth instruction of the decoded plurality of instructions are written into a fourth, different section of each respective vector element of the same resultant vector register without overwriting the results of the first instruction, without overwriting the results of the second instruction, and without overwriting the results of the third instruction.

8. A non-transitory machine readable storage medium that stores program code that when processed by a processor causes the processor to perform a method comprising:
   decoding a plurality of instructions into a decoded plurality of instructions; and
   executing the decoded plurality of instructions, each of said decoded plurality of instructions receiving an input value having a first section to store a location of a byte sequence within data and a second section to store the byte sequence of said data, each of said decoded plurality of instructions having a respective input vector, of multiple input vectors, having multiple elements each having a first section to store a respective location of a respective byte sequence within said data and a second section to store the respective byte sequence of said data, each of said decoded plurality of instructions causing different sections of a same resultant vector register to be written into with their respective results without overwriting a result of another of said decoded plurality of instructions, each of said respective results providing a distance and number of matches between said input value and elements of a respective one of said multiple input vectors.

9. The non-transitory machine readable storage medium of claim 8, the method further comprising decoding a second instruction into a decoded second instruction, and executing the decoded second instruction, after said decoded plurality of instructions have executed, that determines a maximum number of matches within said same resultant vector register.

10. The non-transitory machine readable storage medium of claim 8, wherein each of said plurality of instructions decoded into the decoded plurality of instructions has an instruction format that includes an immediate operand that specifies a maximum permissible distance between said input value and said elements of said respective input vector within said data.

11. The non-transitory machine readable storage medium of claim 8, wherein each of said plurality of instructions decoded into the decoded plurality of instructions has an instruction format that includes an immediate operand that specifies where resultant information is to be written within said same resultant vector register.

12. The non-transitory machine readable storage medium of claim 8, wherein results of a first instruction of the decoded plurality of instructions are written into a first section of each respective vector element of the same resultant vector register, and results of a second instruction of the decoded plurality of instructions are written into a second, different section of each respective vector element of the same resultant vector register without overwriting the results of the first instruction.

13. The non-transitory machine readable storage medium of claim 12, wherein results of a third instruction of the decoded plurality of instructions are written into a third, different section of each respective vector element of the same resultant vector register without overwriting the results of the first instruction and without overwriting the results of the second instruction.

14. The non-transitory machine readable storage medium of claim 13, wherein results of a fourth instruction of the decoded plurality of instructions are written into a fourth, different section of each respective vector element of the same resultant vector register without overwriting the results of the first instruction, without overwriting the results of the second instruction, and without overwriting the results of the third instruction.

* * * * *